US012490456B2

(12) United States Patent
Vellianitis et al.

(10) Patent No.: US 12,490,456 B2
(45) Date of Patent: *Dec. 2, 2025

(54) MULTIGATE DEVICE HAVING REDUCED CONTACT RESISTIVITY

(71) Applicant: Taiwan Semiconductor Manufacturing Co., Ltd., Hsin-Chu (TW)

(72) Inventors: Georgios Vellianitis, Heverlee (BE); Blandine Duriez, Brussels (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/769,940

(22) Filed: Jul. 11, 2024

(65) Prior Publication Data
US 2025/0015154 A1    Jan. 9, 2025

Related U.S. Application Data

(63) Continuation of application No. 18/175,221, filed on Feb. 27, 2023, now Pat. No. 12,080,771, which is a
(Continued)

(51) Int. Cl.
*H10D 30/62* (2025.01)
*H10D 30/67* (2025.01)
(Continued)

(52) U.S. Cl.
CPC ......... *H10D 30/6219* (2025.01); *H10D 30/62* (2025.01); *H10D 30/6735* (2025.01);
(Continued)

(58) Field of Classification Search
CPC ............... H10D 30/62; H10D 30/6735; H10D 30/6757; H10D 84/0128; H10D 84/013;
(Continued)

(56) References Cited

U.S. PATENT DOCUMENTS 8,785,981 B1   7/2014   Chang et al.
9,917,060 B1   3/2018   Gluschenkov et al.
(Continued)

FOREIGN PATENT DOCUMENTS

CN   109326645 A   2/2019
CN   109728071 A   5/2019
(Continued)

*Primary Examiner* — Changhyun Yi
(74) *Attorney, Agent, or Firm* — HAYNES AND BOONE, LLP

(57) ABSTRACT

An exemplary method includes forming an opening in an interlevel dielectric (ILD) layer. The opening in the ILD layer exposes a doped epitaxial layer. The method further includes performing an in-situ doping deposition process, an annealing process, and an etching process to form a doped semiconductor layer over the doped epitaxial layer. The doped semiconductor layer partially fills the opening. The method further includes forming a metal-comprising structure that fills a remainder of the opening. The metal-comprising structure is disposed over a top and sidewalls of the doped epitaxial layer. The doped semiconductor layer is disposed between the metal-comprising structure and the top of the doped epitaxial layer and between the metal-comprising structure and the sidewalls of the doped epitaxial layer. The in-situ deposition process may implement a temperature less than about 350° C. The doped epitaxial layer includes p-type dopant (e.g., boron), and the doped semiconductor layer includes gallium.

20 Claims, 23 Drawing Sheets

Related U.S. Application Data continuation of application No. 17/162,994, filed on Jan. 29, 2021, now Pat. No. 11,594,603.

(60) Provisional application No. 63/032,389, filed on May 29, 2020.

(51) Int. Cl.
*H10D 84/01* (2025.01)
*H10D 84/03* (2025.01)

(52) U.S. Cl.
CPC ..... *H10D 30/6757* (2025.01); *H10D 84/0128* (2025.01); *H10D 84/013* (2025.01); *H10D 84/038* (2025.01)

(58) Field of Classification Search
CPC ............. H10D 84/038; H10D 30/6219; H10D 30/797; H10D 62/822
See application file for complete search history.

(56) References Cited

U.S. PATENT DOCUMENTS

| | | | |
|---|---|---|---|
| 11,594,603 B2* | 2/2023 | Vellianitis | H01L 21/02675 |
| 2014/0151638 A1* | 6/2014 | Chang | H10D 62/121 |
| | | | 257/27 |
| 2014/0264276 A1 | 9/2014 | Chang et al. | |
| 2016/0204117 A1 | 7/2016 | Liu et al. | |
| 2017/0140996 A1* | 5/2017 | Lin | H10D 64/017 |
| 2017/0213739 A1 | 7/2017 | Gluschenkov et al. | |
| 2019/0305106 A1* | 10/2019 | Bi | H10D 30/6212 |
| 2019/0326288 A1 | 10/2019 | Hashemi et al. | |
| 2020/0013900 A1 | 1/2020 | Carr et al. | |

FOREIGN PATENT DOCUMENTS

| | | |
|---|---|---|
| CN | 109860275 A | 6/2019 |
| CN | 110556374 A | 12/2019 |

* cited by examiner

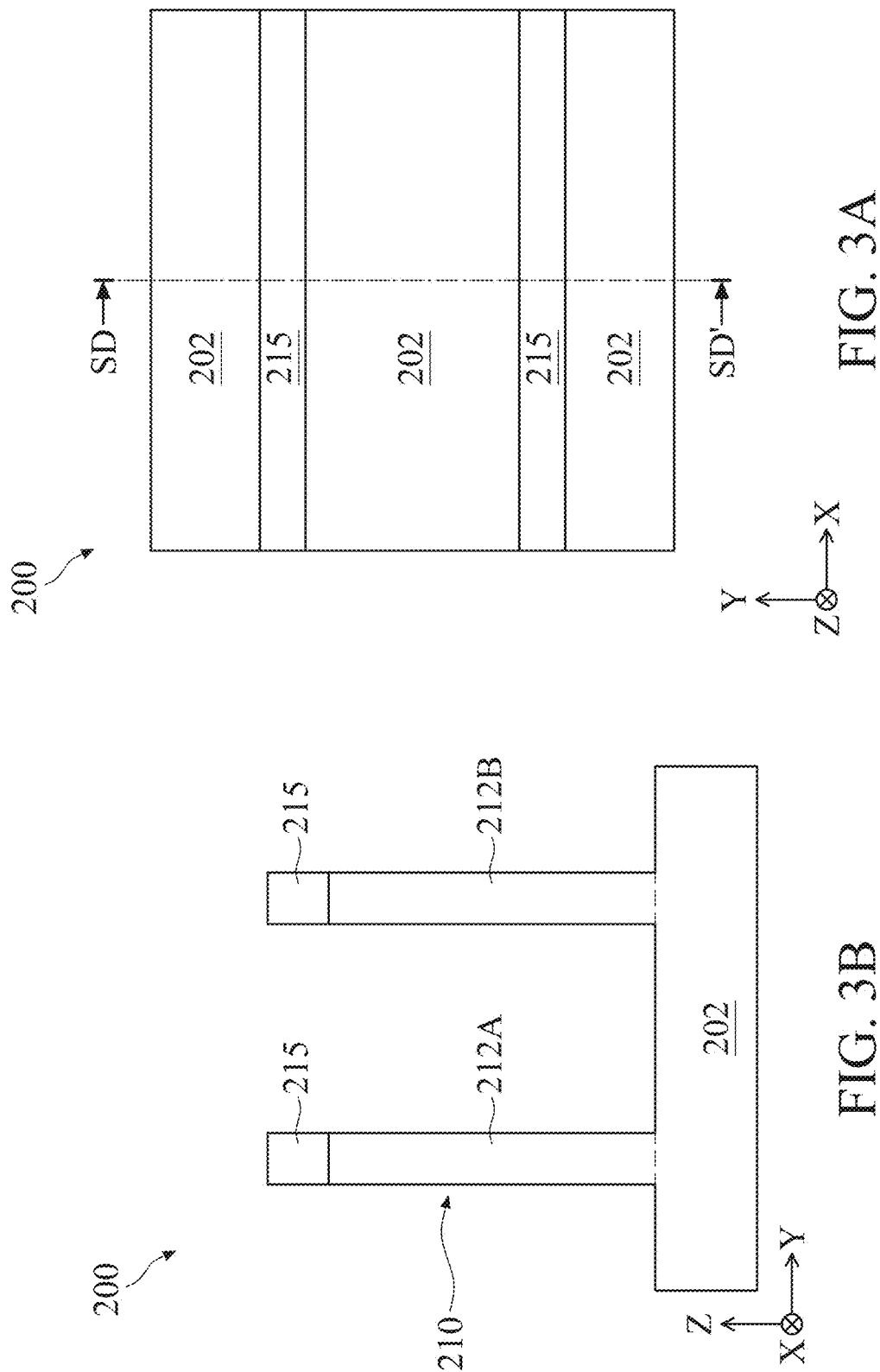

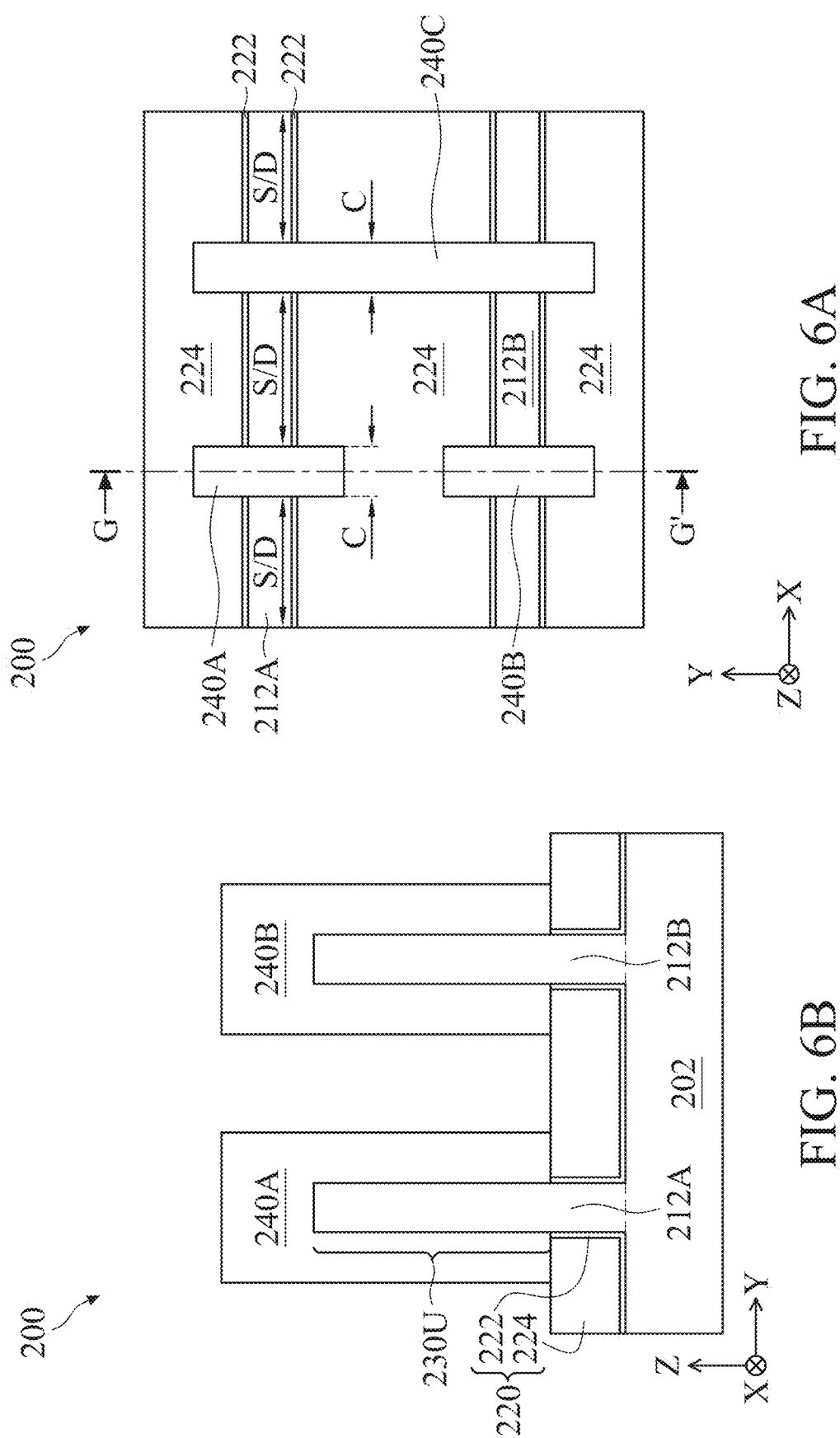

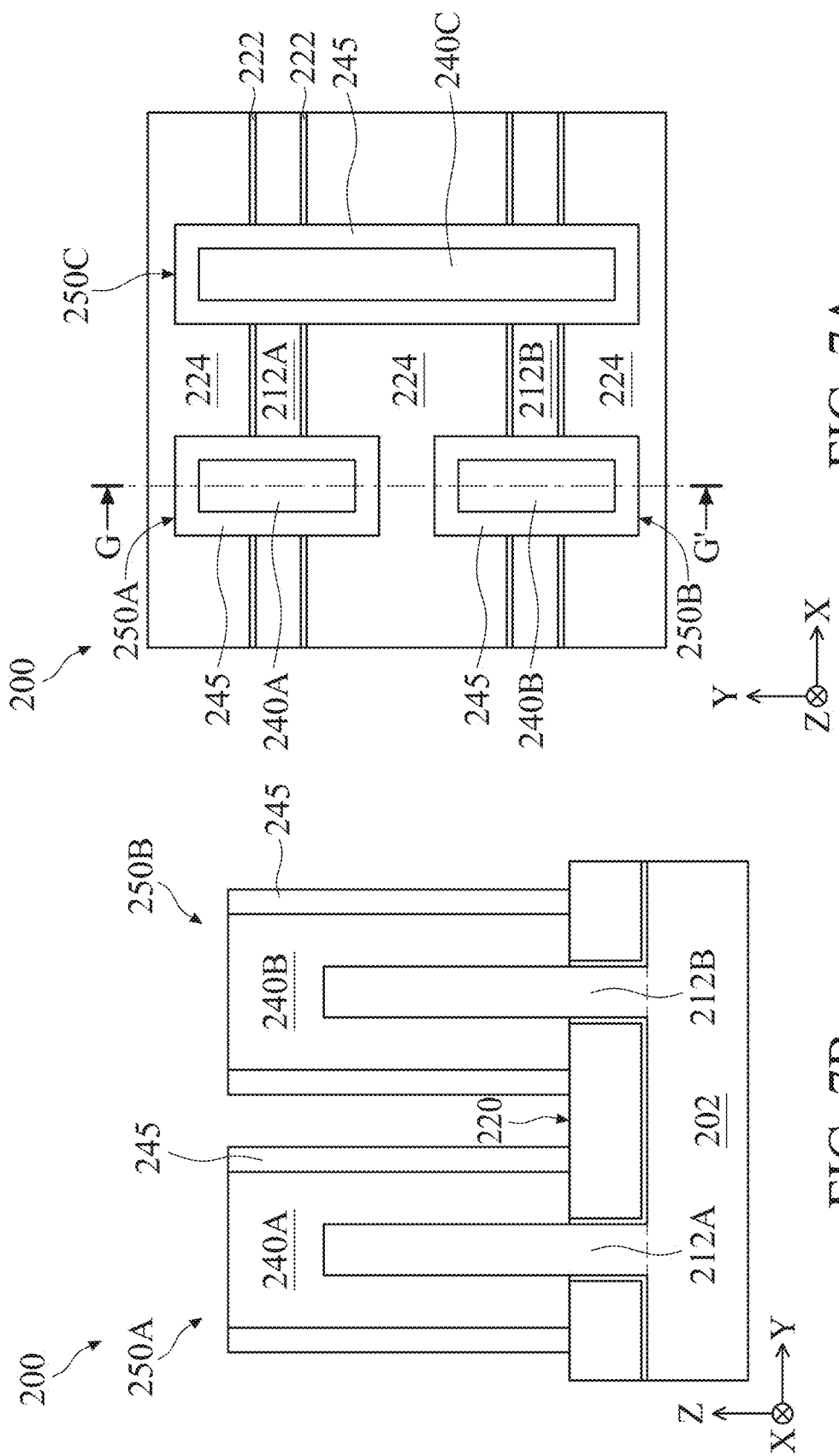

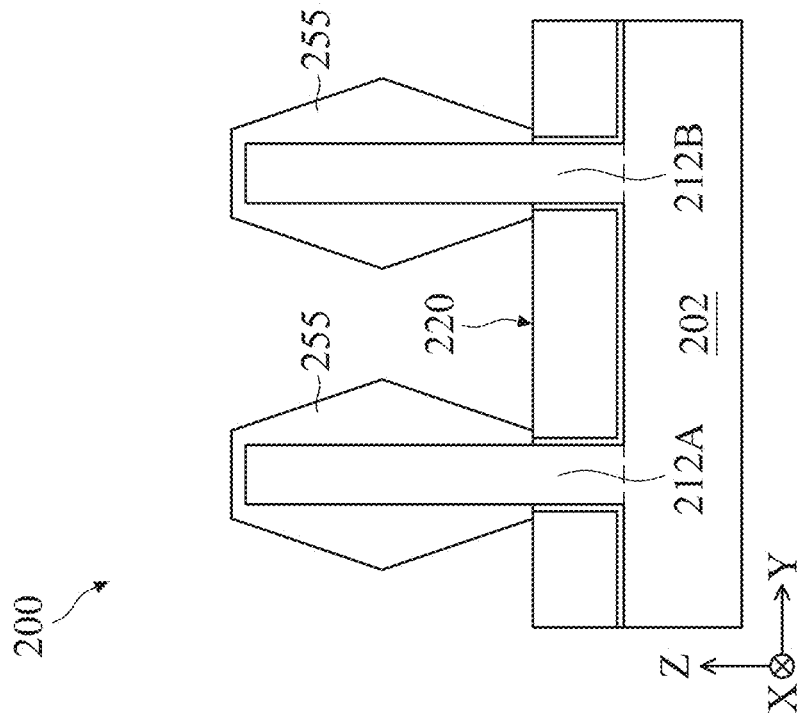
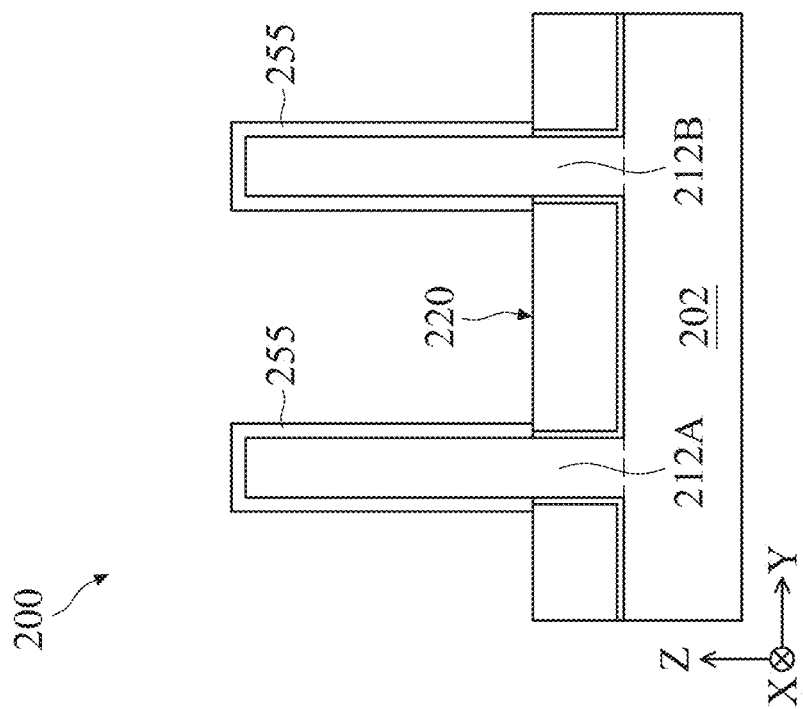

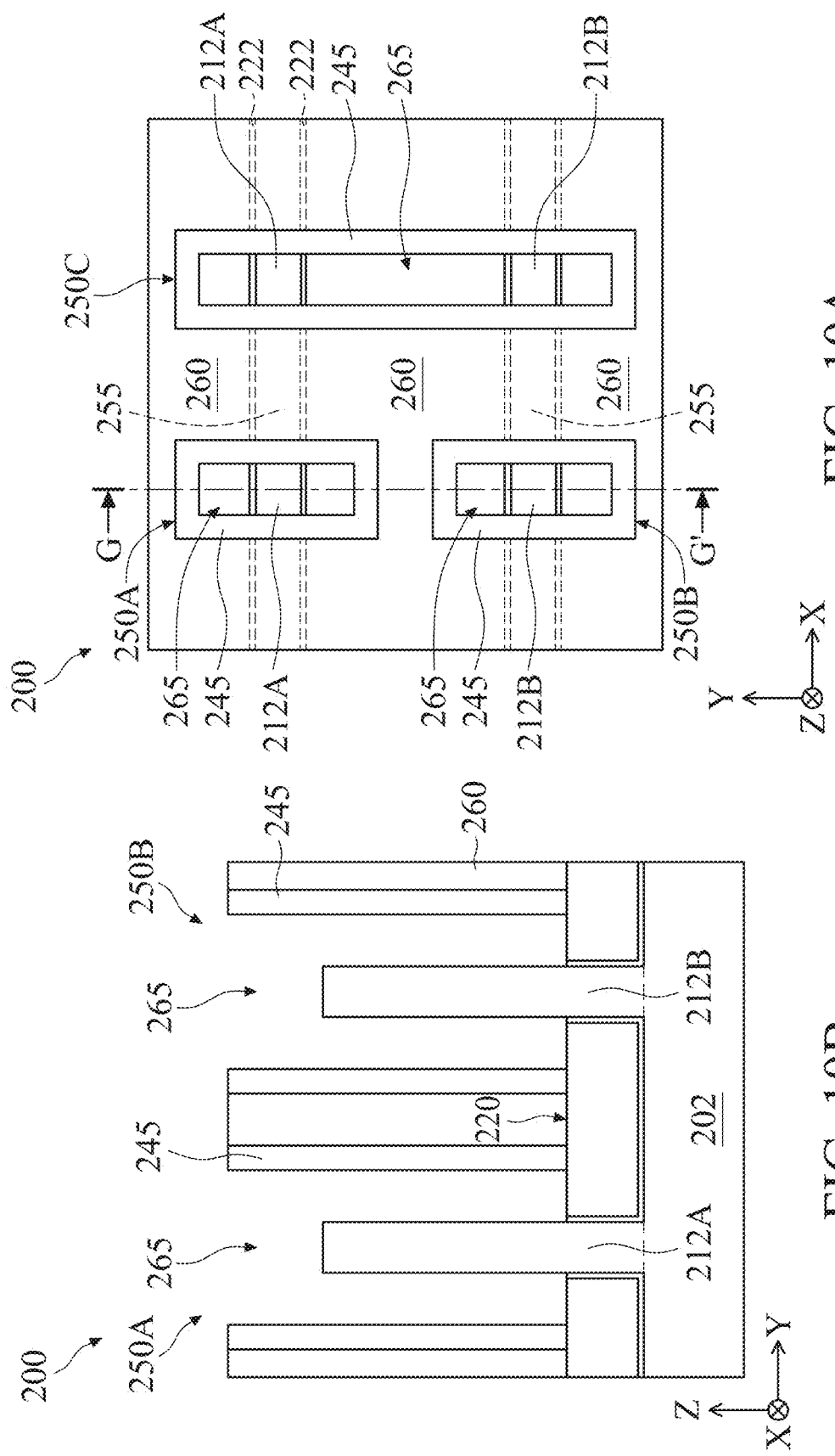

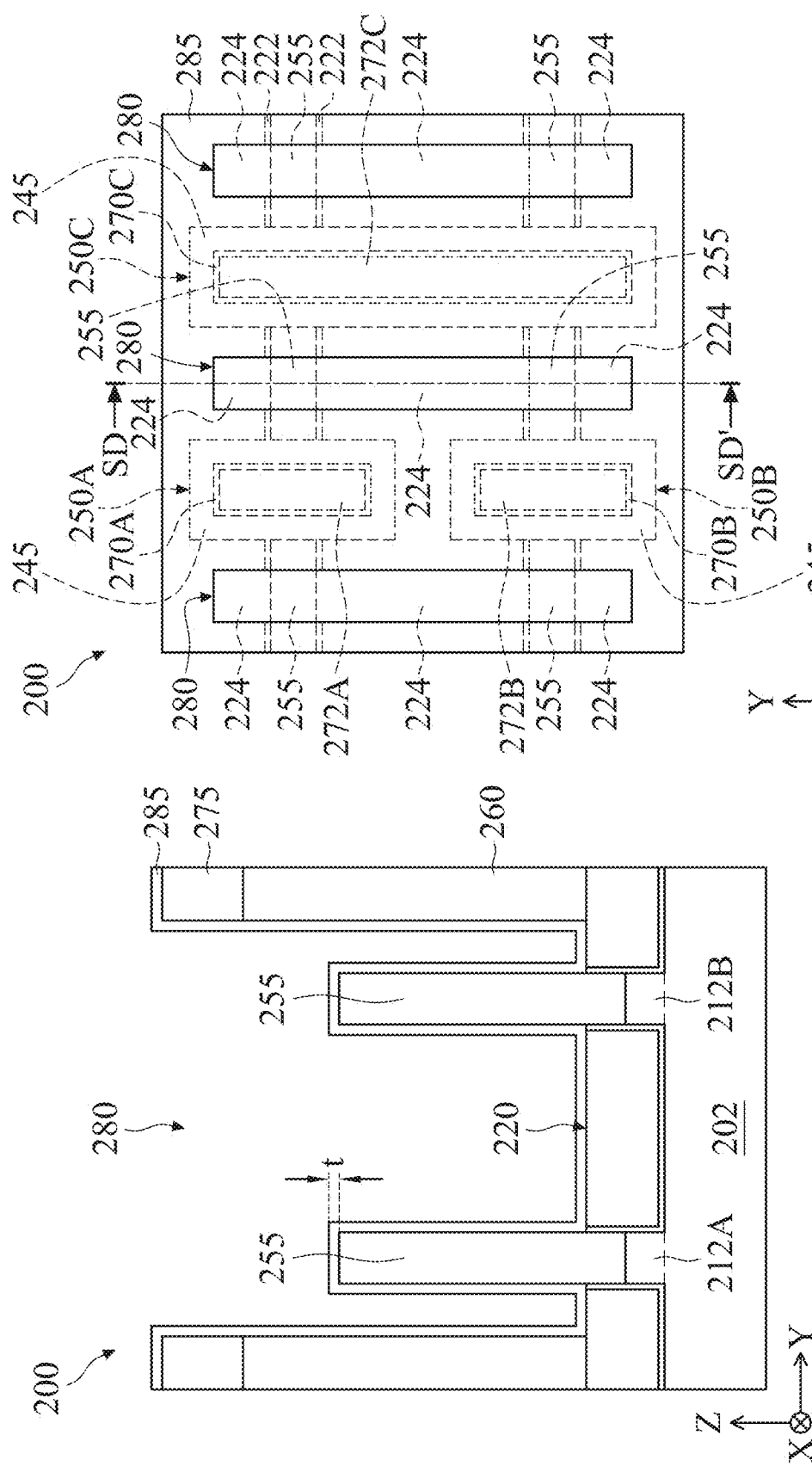

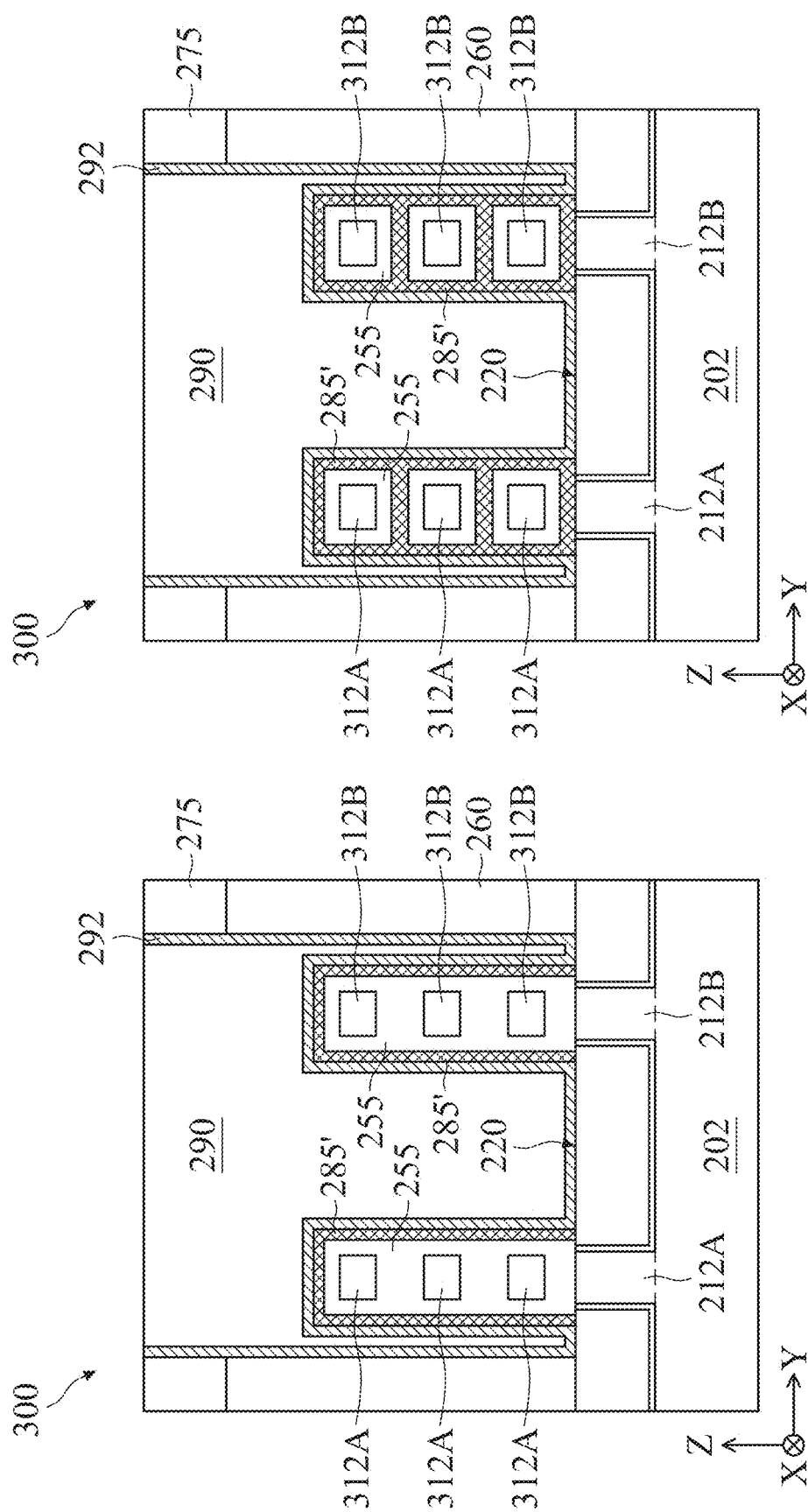

MULTIGATE DEVICE HAVING REDUCED CONTACT RESISTIVITY

This is a continuation application of U.S. patent application Ser. No. 18/175,221, filed Feb. 27, 2023, which is a continuation application of U.S. patent application Ser. No. 17/162,994, filed Jan. 29, 2021, which is a non-provisional application of and claims benefit of U.S. Provisional Patent Application Ser. No. 63/032,389, filed May 29, 2020, the entire disclosures of which are incorporated herein by reference.

BACKGROUND

Multigate devices have been introduced to meet the integrated circuit (IC) industry's ever-increasing demand for smaller and faster electronic devices that can simultaneously support a greater number of increasingly complex and sophisticated functions. Multigate devices have a gate that extends, partially or fully, around a channel region to provide access to the channel region on at least two sides. Exemplary multi-gate devices include fin-like field effect (FinFET) transistors, gate-all-around (GAA) transistors (e.g., nanowire-based transistors), and/or other three-dimensional (3D) transistors, all of which can be referred to as non-planar transistors. Multigate devices enable aggressive scaling down of IC technologies and have been observed to improve gate control, increase gate-channel coupling, reduce off-state current, and/or reduce short-channel effects (SCEs), while seamlessly integrating with conventional IC manufacturing processes. Typically, scaling of multigate devices has been limited only by an ability to lithographically define IC features at the ever-decreasing geometry sizes, but more recently, parasitic resistance-capacitance (RC) delay has arisen as a significant challenge as geometry sizes are reduced to achieve multigate devices with faster operating speeds (e.g., by reducing distances traveled by electrical signals), thereby negating some of the advantages achieved by scaling down and limiting further scaling down of multigate devices. For example, decreasing source/drain contact size has led to increases in source/drain contact resistance (i.e., resistance to a flow of current at a metal-semiconductor contact interface, such as that between a semiconductor-comprising source/drain feature and a metal-comprising source/drain contact). One solution for reducing source/drain contact resistance is to reduce contact resistivity at the metal-semiconductor contact interface. However, current contact resistivity reduction methods are not compatible with fabrication of non-planar transistors. Accordingly, although existing source/drain contact structures for multigate devices and methods for the fabricating existing source/drain contact structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B-1, FIG. 8B-2, FIG. 8B-3, FIG. 9A, FIG. 9B, FIG. 9C, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B-1, FIG. 17B-2, and FIG. 17B-3 are fragmentary perspective views of a multigate device, in portion or entirety, at various fabrication stages (such as those associated with the method in FIG. 1) according to various aspects of the present disclosure.

FIGS. 18A, FIG. 18B, FIG. 18C-1, FIG. 18C-2, and FIG. 18C-3 are fragmentary perspective views of a multigate device, in portion or entirety, that can be fabricated using the method for fabricating the source/drain contact of FIG. 1 according to various aspects of the present disclosure.

DETAILED DESCRIPTION

Figure 1:
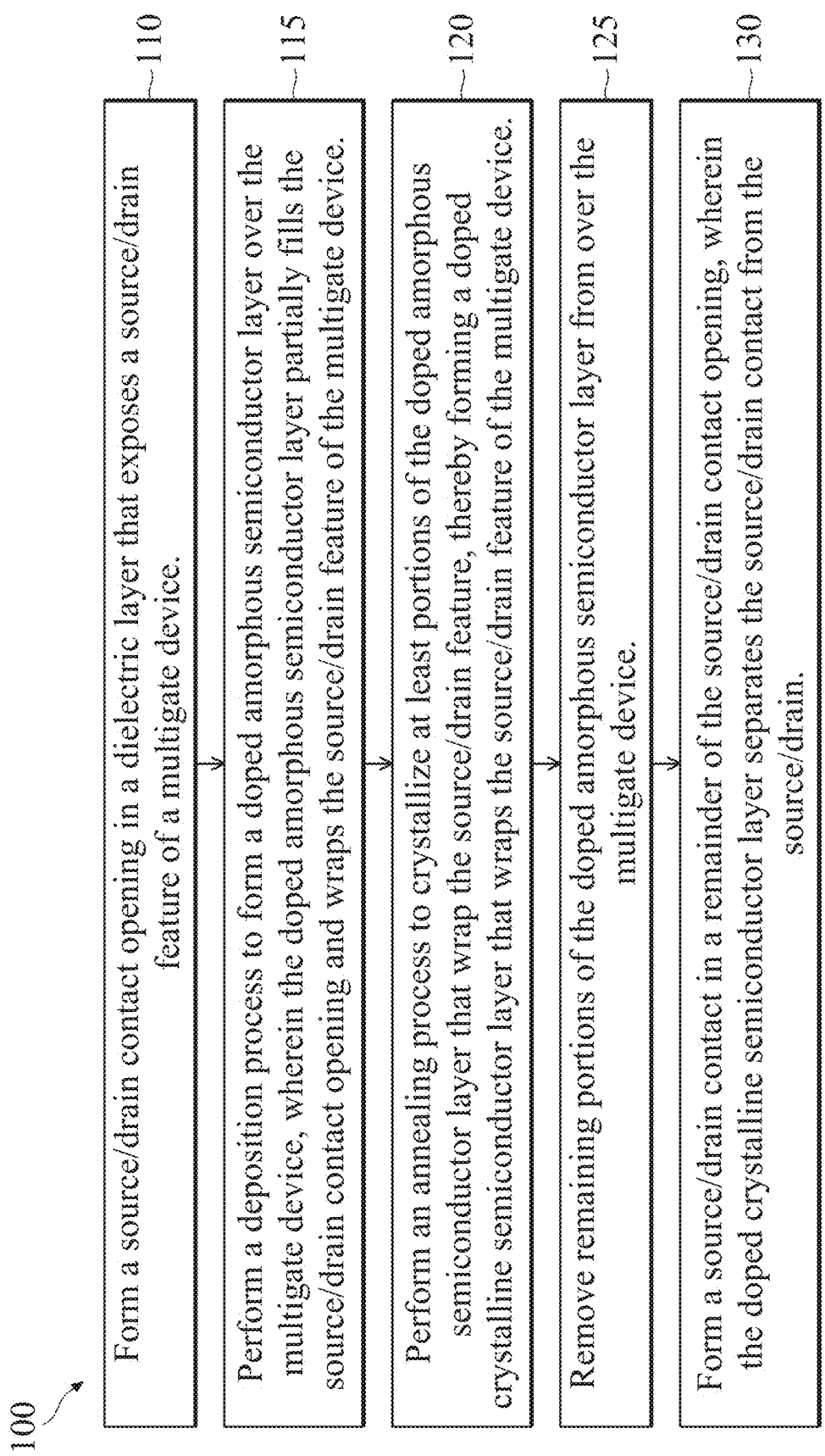
FIG. 1 is a flow chart of a method for fabricating a source/drain contact of a multigate device according to various aspects of the present disclosure.

The present disclosure relates generally to multigate devices, and more particularly, to source/drain contact structures for multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Recently, parasitic resistance-capacitance (RC) delay has arisen as a significant challenge as geometry sizes of integrated circuit (IC) features are reduced to achieve multigate devices with faster operating speeds (e.g., by reducing distances traveled by electrical signals), thereby negating some of the advantages achieved by scaling down of multigate devices and limiting further scaling down of multigate devices. For example, decreasing source/drain contact size has led to increases in source/drain contact resistance (i.e., resistance to a flow of current at a metal-semiconductor contact interface, such as that between a semiconductor-comprising source/drain feature and a metal-comprising source/drain contact). Increasing dopant levels (for example, dopant concentrations) at the metal-semiconductor contact interface can reduce contact resistivity at the metal-semiconductor contact interface, thereby reducing source/drain contact resistance and improving performance. Current methods for increasing dopant levels at the metal-semiconductor contact interface, and thereby reduce contact resistivity, are often performed during source/drain contact formation. In an example method, after forming a source/drain contact opening that exposes a source/drain feature, an ion implantation process is performed on a semiconductor material of the metal-semiconductor contact interface, which can be a portion of the source/drain feature and/or a semiconductor layer formed over the source/drain feature before the ion implantation process, to increase a dopant level of a dopant in the semiconductor material before forming a source/drain contact. In another example method, after forming a source/drain contact opening that exposes a source/drain feature, a doped epitaxial layer is grown from the source/drain feature by an epitaxial growth process (epi process) before forming a source/drain contact, where dopant having dopant levels higher than dopant levels of dopant in the source/drain feature is introduced into an epitaxial material during the epi process (i.e., in-situ) or by an ion implantation process after the epi process. However, both of these example methods are not compatible with fabrication of non-planar transistors because each typically requires high thermal budgets, such as process temperatures that are greater than about 350° C. These high thermal budget processes can damage channels of multigate devices, for example, by undesirably relaxing or increasing strain in channel regions of the multigate devices and/or undesirably diffusing dopants within the multigate devices, altering desired device performance characteristics of the multigate devices.

The present disclosure proposes inserting a doped crystalline semiconductor layer, such as a gallium-doped crystalline germanium layer, between a source/drain feature and a source/drain contact of a multigate device to reduce contact resistivity. The doped crystalline semiconductor layer is formed without performing an ion implantation process and without performing an epitaxial growth process. For example, after forming a source/drain contact opening to expose a source/drain feature of a multigate device, the proposed doped crystalline semiconductor layer is formed by depositing a doped amorphous semiconductor layer over the source/drain feature and performing an annealing process (e.g., a laser annealing) to crystallize the doped amorphous semiconductor layer, thereby forming the doped crystalline semiconductor layer. The deposition process in-situ dopes a semiconductor material, such that a separate doping process (e.g., an ion implantation process) is not performed to introduce dopant into the semiconductor material. In some embodiments, the deposition process is a physical vapor deposition process that implements a dopant target (e.g., a gallium target). In some embodiments, the deposition process is an atomic layer deposition process that implements a dopant precursor (e.g., a gallium precursor). The deposition process can be performed at low temperatures, such as less than or equal to about 350° C., minimizing any damage to and/or modification of features of the multigate device. Thereafter, a source/drain contact is formed in the source/drain contact opening and over the doped crystalline semiconductor layer, such that a metal-semiconductor contact interface includes an interface between the source/drain contact and the doped crystalline semiconductor layer. It has been observed that contact resistivity at a metal-semiconductor contact interface having the doped crystalline semiconductor layer fabricated by the methods disclosed herein is less than contact resistivity at metal-semiconductor contact interfaces fabricated by current methods, such as those that increase doping levels by ion implantation and/or by introducing dopants during epitaxial growth. In some embodiments, a dopant level of a dopant (e.g., gallium) in the doped crystalline semiconductor layer is greater than a solid solubility limit of the dopant, which has been observed to significantly reduce contact resistivity, and in some embodiments, provide contact resistivity less than or equal to about $1\times10^{-9}$ $\Omega$-cm$^2$. In some embodiments, the doped crystalline semiconductor layer is free of carbon, which current methods may introduce to reduce contact resistivity but risk deactivating dopant (in particular, p-type dopant) in the source/drain feature. The proposed source/drain contact fabrication techniques for lowering contact resistivity are compatible with and integrate seamlessly into conventional multigate device fabrication. Details of the proposed source/drain contact structures for multigate devices and corresponding methods of fabrication are described herein in the following pages and/or drawings.

FIG. 1 is a flow chart of a method 100 for fabricating a source/drain contact of a multigate device according to various aspects of the present disclosure. At block 110, method 100 includes forming a source/drain contact opening in a dielectric layer that exposes a source/drain feature of a multigate device. At block 115, method 100 includes performing a deposition process to form a doped amorphous semiconductor layer over the multigate device. The doped amorphous semiconductor layer partially fills the source/drain contact opening and wraps the source/drain feature of the multigate device. In some embodiments, the doped amorphous semiconductor layer is a gallium-doped amorphous germanium layer. The doped amorphous semiconductor layer is formed without performing an ion implantation process and without performing an epitaxial process. At block 120, method 100 includes performing an annealing process to crystallize at least portions of the doped amorphous semiconductor layer that wrap the source/drain feature, thereby forming a doped crystallized semiconductor layer that wraps the source/drain feature of the multigate device. In some embodiments, the doped amorphous semiconductor layer is a gallium-doped crystalline germanium layer. In some embodiments, method 100 implements block 125, which includes removing remaining portions of the doped amorphous semiconductor layer from over the multigate device. In some embodiments, remaining portions of the doped amorphous semiconductor layer are removed by a dry etching process, which selectively removes the doped amorphous semiconductor layer relative to the doped crystalline semiconductor layer. At block 130, method 100 includes forming a source/drain contact in a remainder of the source/drain contact opening. The doped crystalline semiconductor layer separates the source/drain contact from the source/drain feature of the multigate device. In some embodiments, the multigate device is a fin-like field effect transistor (FinFET), which has a metal gate that wraps a channel region of a fin (i.e., a fin-like channel layer) that extends from a substrate. In such embodiments, the doped crystalline semiconductor layer can further wrap a source/ drain region of the fin depending on a configuration of the fin and the epitaxial source/drain feature. In some embodiments, the multigate device is a gate-all-around (GAA) transistor, which has a metal gate that surrounds a channel region of a semiconductor layer suspended over and separated from a substrate (e.g., nanowire, nanobar, nanosheet, and/or other type of nanostructure). In such embodiments, the doped crystalline semiconductor layer can further surround a source/drain region of the suspended semiconductor layer. In some embodiments, the multigate device is any type of transistor having a metal gate that physically contacts at least two sides of a channel layer. In such embodiments, the doped crystalline semiconductor layer can further physically contact at least two sides of a source/drain region and/or a source/drain feature of the multigate device. Additional steps can be provided before, during, and after method 100, and some of the steps described can be moved, replaced, or eliminated for additional embodiments of method 100. The discussion that follows illustrates various embodiments of multigate-based integrated circuit devices that can be fabricated according to method 100.

Figure 8A:
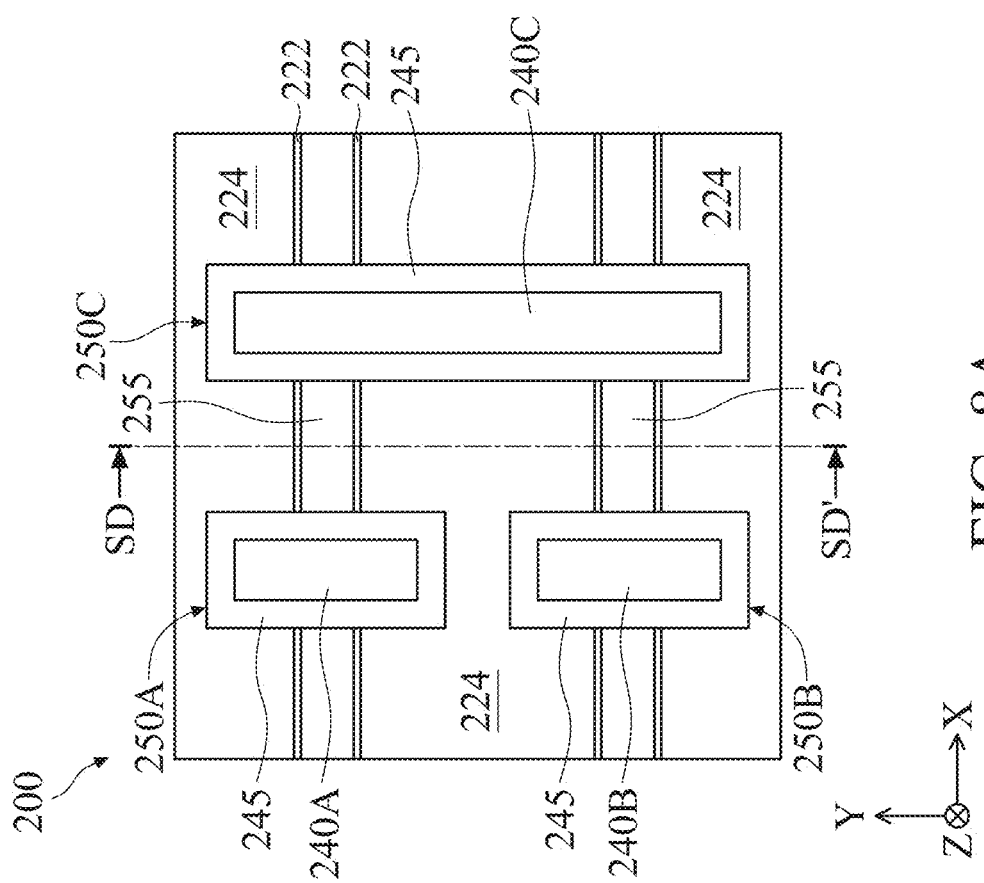
Figures 1, 8B:
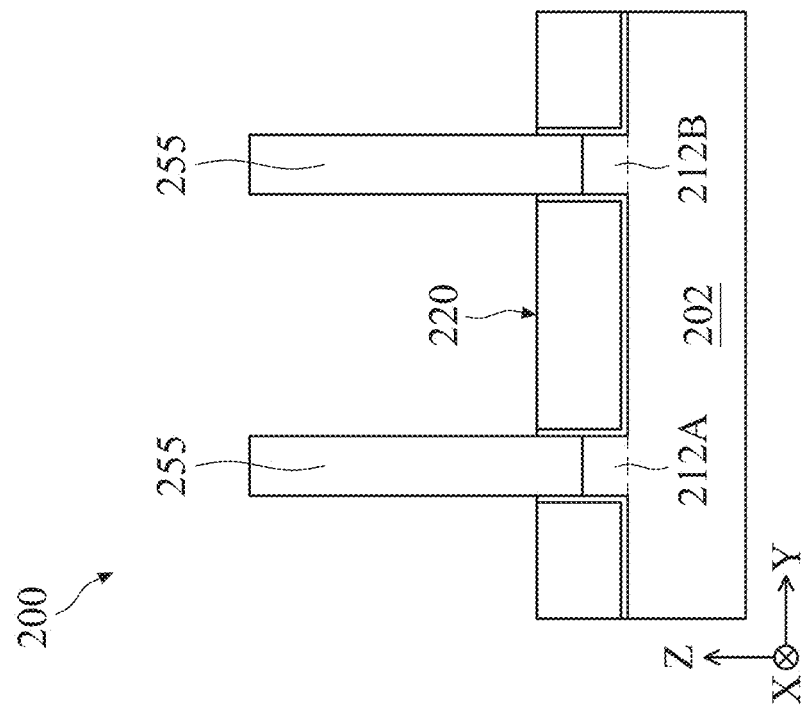
Figures 9A, 9B:
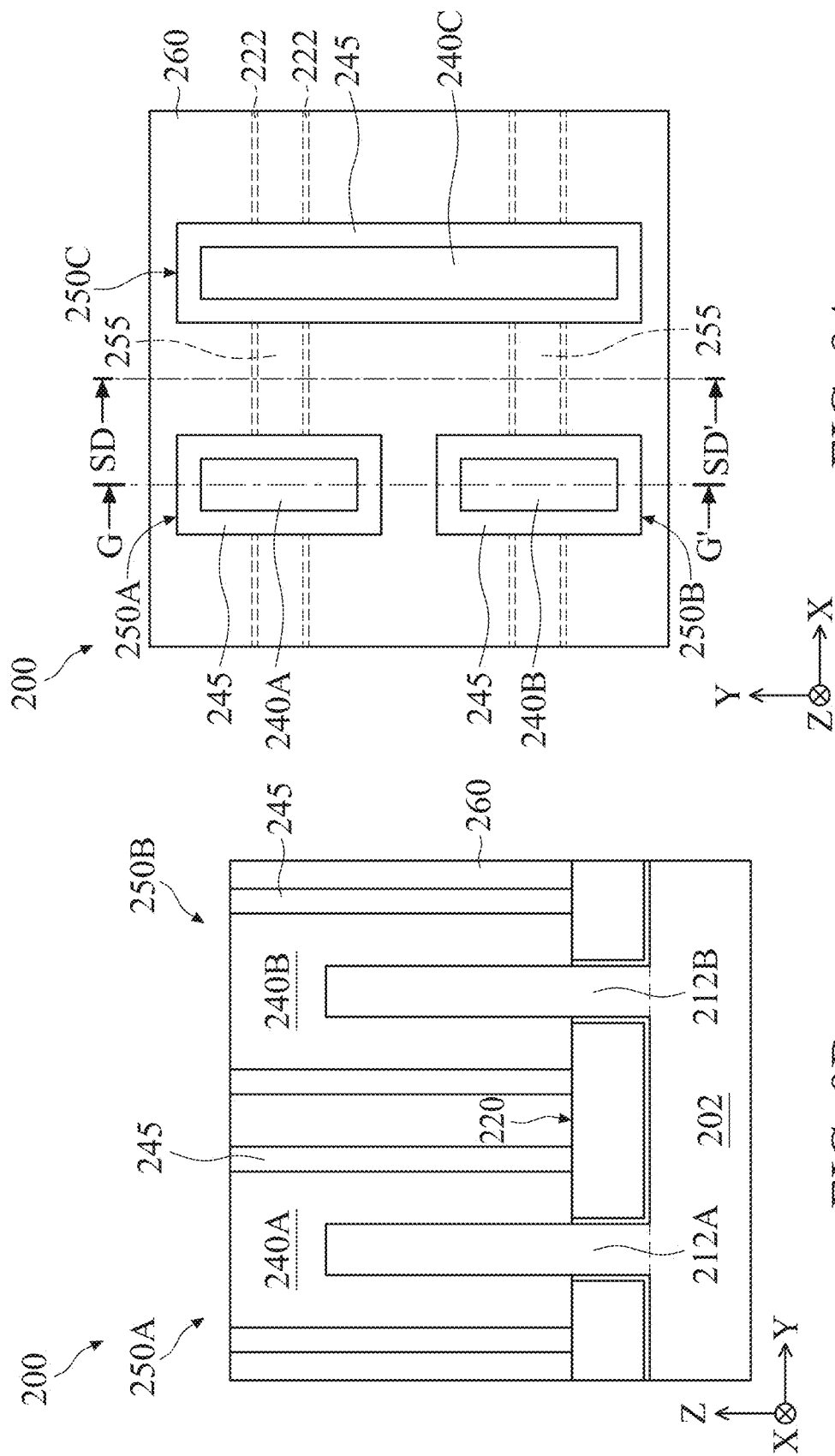
Figure 9C:
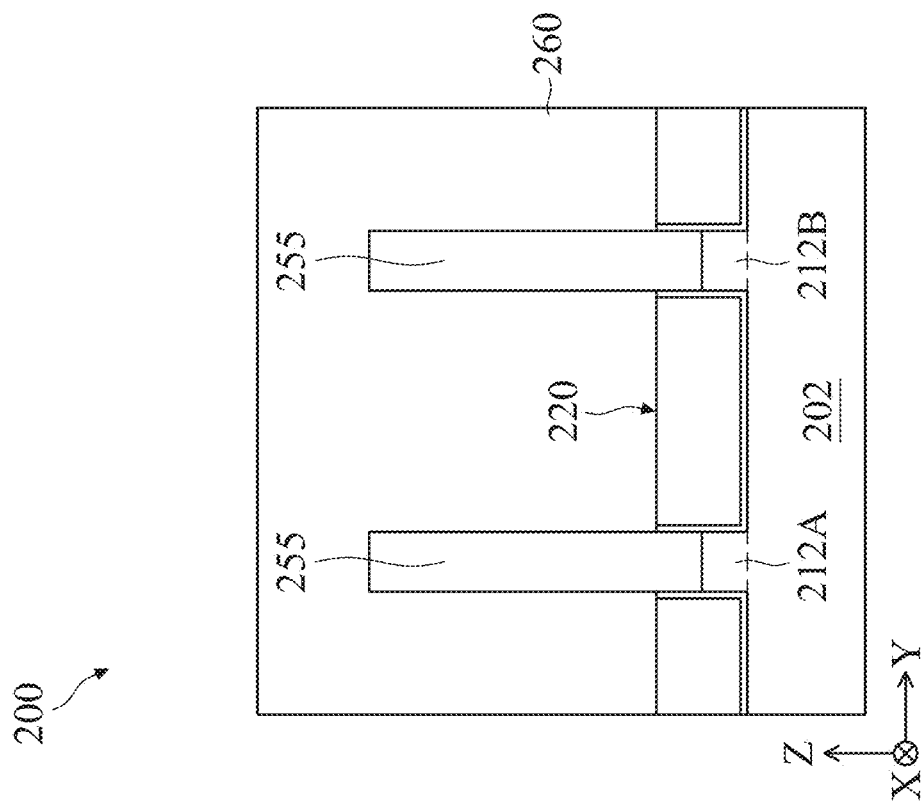

FIGS. 2A-17A, FIGS. 2B-17B (of which FIG. 8B collectively refers to FIG. 8B-1, FIG. 8B-2, and FIG. 8B-3 and FIG. 17B collectively refers to FIG. 17B-1, FIG. 17B-2, and FIG. 17B-3), and FIG. 9C are fragmentary diagrammatic views of a multigate device 200, in portion or entirety, at various fabrication stages (such as those associated with method 100 in FIG. 1) according to various aspects of the present disclosure. In particular, FIGS. 2A-17A are top views of multigate device 200 in an X-Y plane and FIGS. 2B-17B and FIG. 9C are diagrammatic cross-sectional views of multigate device 200 in a Y-Z plane along either line G-G' respectively of FIGS. 2A-17A (which are metal gate cut cross-sectional views) or line SD-SD' respectively of FIGS. 2A-17A (which are source/drain cut cross-sectional views). In the depicted embodiment, multigate device 200 is processed to include a fin-like field effect transistor (FinFET), though the present disclosure contemplates embodiments where multigate device 200 is processed to include a gate-all-around (GAA) transistor. Multigate device 200 can include various passive and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. Multigate device 200 can be included in a microprocessor, a memory, and/or other IC device. In some embodiments, multigate device 200 is a portion of an IC chip, a system on chip (SoC), or portion thereof. FIGS. 2A-17A, FIGS. 2B-17B, and FIG. 9C have been simplified for the sake of clarity to better understand the inventive concepts of the present disclosure. Additional features can be added in multigate device 200, and some of the features described below can be replaced, modified, or eliminated in other embodiments of multigate device 200.

Figure 2A:
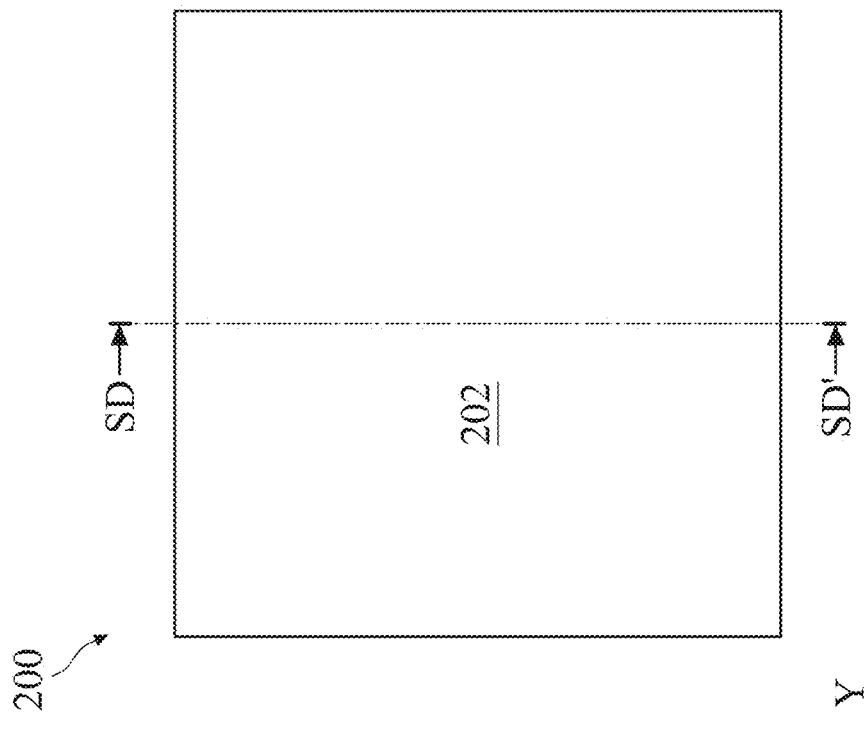
Figure 2B:
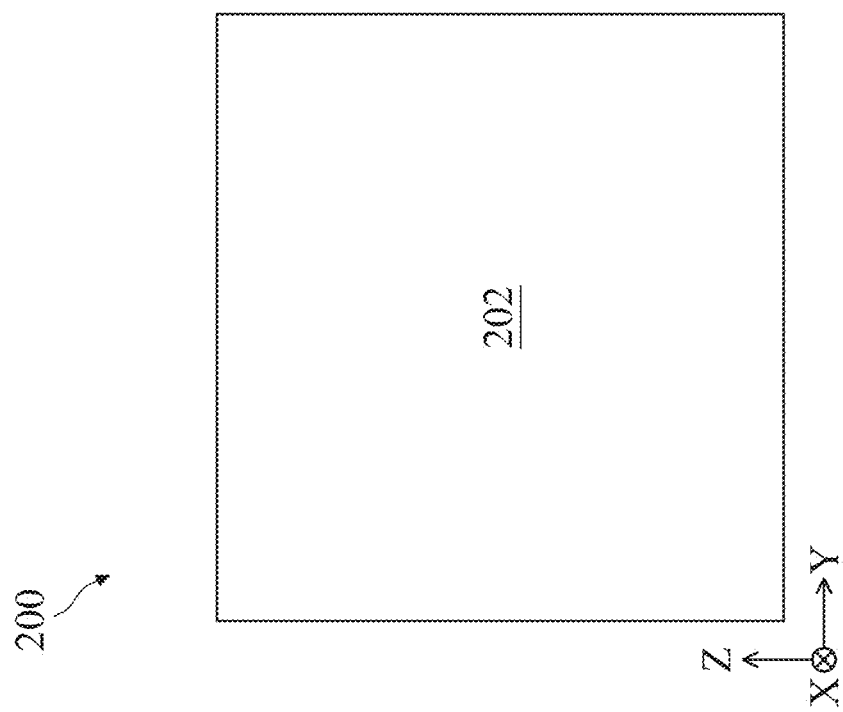

Turning to FIG. 2A and FIG. 2B, multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In some embodiments, substrate 202 includes p-type doped regions (referred to as p-wells) and/or n-type doped regions (referred to as n-wells). For example, portions of substrate 202 that correspond with n-type transistors of multigate device 200 can include p-wells and portions of substrate 202 that correspond with p-type transistors of multigate device 200 can include n-wells. The n-wells are doped with n-type dopants, such as phosphorus, arsenic, other n-type dopant, or combinations thereof. The p-wells are doped with p-type dopants, such as boron, indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Turning to FIG. 3A and FIG. 3B, a fin fabrication process is performed to form a fin structure 210 over substrate 202. For example, multiple fins, such as a fin 212A and a fin 212B (also referred to as fin structures, fin elements, fin active regions, etc.), extend from substrate 202, each of the multiple fins having a portion of a patterning layer 215 (also referred to as a patterned hard mask layer) disposed thereover, after the fin fabrication process. The present disclosure contemplates embodiments where fin structure 210 includes more fins or a single fin extending from substrate 202. Fins 212A, 212B extend substantially parallel to one another along an x-direction, each having a length defined in the x-direction, a width defined in a y-direction, and a height defined in the z-direction. In some embodiments, fins 212A, 212B are a portion of substrate 202. For example, in the depicted embodiment, where substrate 202 includes silicon, fins 212A, 212B include silicon. Alternatively, fins 212A, 212B are defined in a material layer, such as a semiconductor material layer, disposed over substrate 202. The semiconductor material may be silicon, germanium, silicon germanium, III-V semiconductor material, other suitable semiconductor material, or combinations thereof. For example, in some embodiments, before performing the fin fabrication process, a germanium layer is formed over substrate 202, for example, by an epitaxial growth process, and fins 212A, 212B are formed from germanium layer (i.e., fins 212A, 212B include germanium). In some embodiments, the germanium layer is doped with p-type dopants, n-type dopants, or combinations thereof. In some embodiments, fins 212A, 212B each include a semiconductor layer stack disposed over substrate 202. Semiconductor layers of the semiconductor layer stack can include same or different materials, dopants, etching rates, constituent atomic percentages, constituent weight percentages, thicknesses, and/or configurations depending on design requirements of multigate device 200.

A combination of deposition, lithography, and/or etching processes are performed to define fins 212A, 212B extending from substrate 202. For example, forming fins 212A, 212B includes depositing a mask layer over substrate 202

(or a material layer disposed over substrate 202), performing a lithography process to pattern the mask layer (thereby forming a patterned mask layer, such as patterning layer 215), and performing an etching process to transfer a pattern defined in the patterned mask layer to substrate 202 (or the material layer disposed thereover). The lithography process can include forming a resist layer over the mask layer and/or substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process can remove portions of substrate 202 using the patterned resist layer as an etch mask. In the depicted embodiment, where the patterned resist layer is formed over the mask layer, a first etching process can remove portions of the mask layer to form a patterned mask layer (i.e., patterning layer 215), and a second etching process can remove portions of substrate 202 using patterning layer 215 as an etch mask. The etching process can include a dry etching process, a wet etching process, other suitable etching process, or combinations thereof. In some embodiments, the etching process is a reactive ion etching (RIE) process. In some embodiments, the etching process is a dry etching process, where a duration of the dry etching process is tuned to achieve a desired height of fin 212A and fin 212B (i.e., a timed dry etching process). After the etching process, the patterned resist layer is removed, for example, by a resist stripping process or other suitable process. Alternatively, fin structure 210 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Such processes can also provide fin structure 210 as depicted in FIG. 3A and FIG. 3B. In some embodiments, directed self-assembly (DSA) techniques are implemented while patterning substrate 202. Further, in some embodiments, the exposure process can implement maskless lithography, electron-beam (e-beam) writing, and/or ion-beam writing for patterning the resist layer.

Figure 4A:
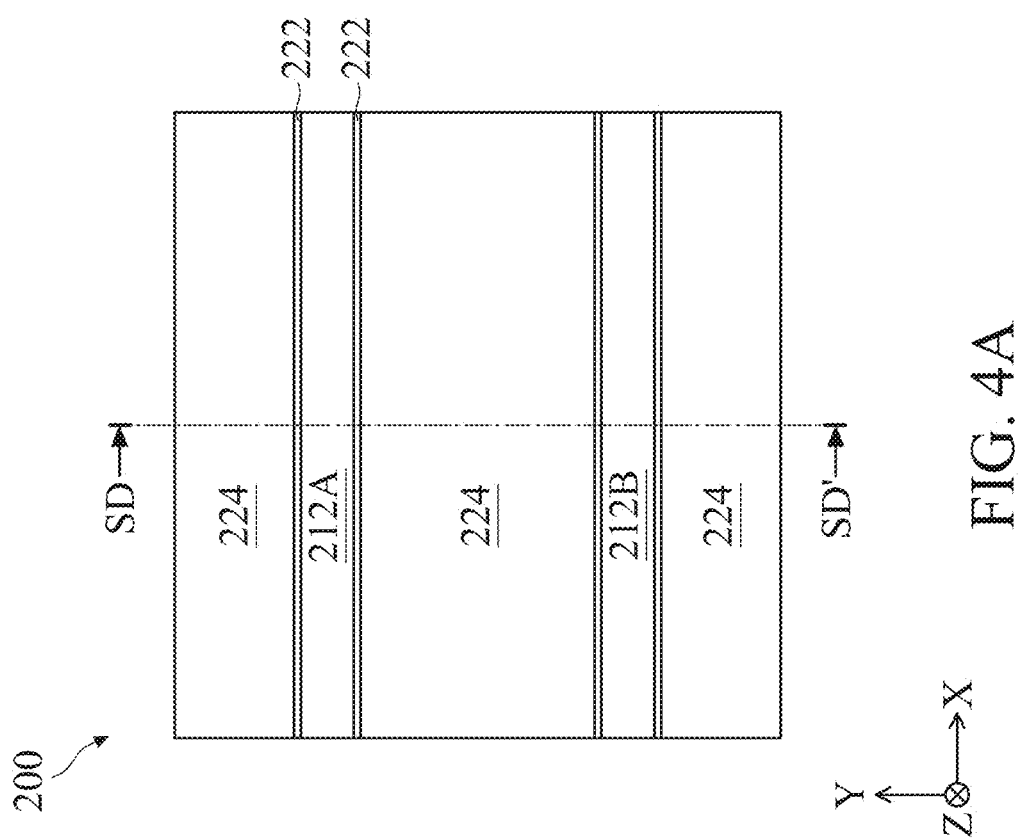
Figure 4B:
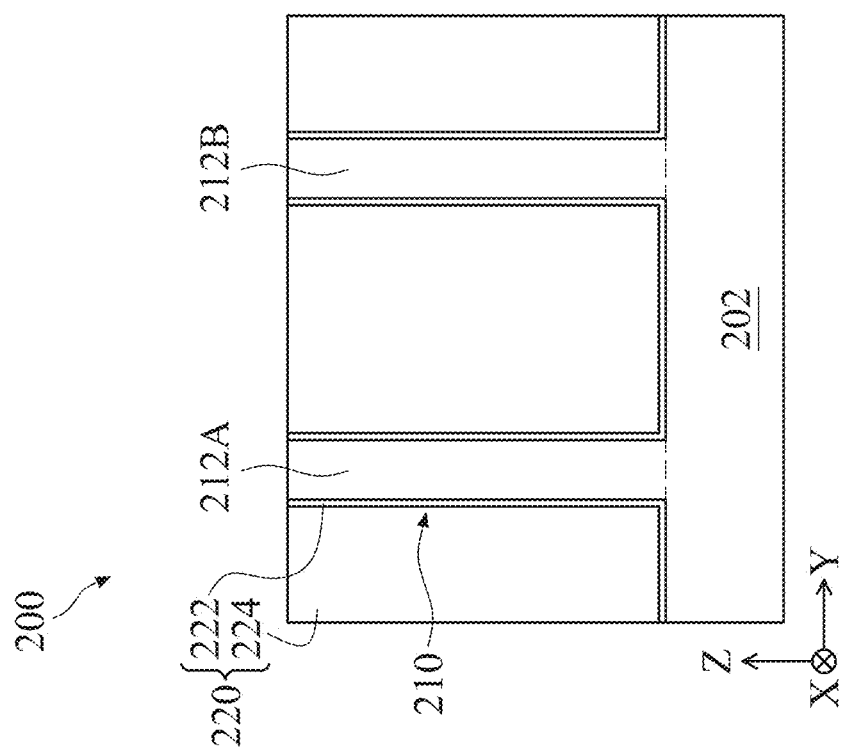

Turning to FIG. 4A and FIG. 4B, isolation features 220 are formed over and/or in substrate 202 to separate and isolate various regions of multigate device 200, such as fin 212A from fin 212B. Isolation features 220 include an insulator material that fills trenches defined by fins 212A, 212B, such that isolation features 220 define and electrically isolate fins 212A, 212B from other active regions, such as other fins, of multigate device 200. Isolation features 220 include silicon oxide, silicon nitride, silicon oxynitride, other suitable isolation and/or insulation material (for example, including silicon, oxygen, nitrogen, carbon, or other suitable isolation constituent), or combinations thereof. In FIG. 4A and FIG. 4B, isolation features 220 include a liner layer 222 and an oxide layer 224. Liner layer 222 is disposed along surfaces of multigate device 200 that define isolation trenches, such as sidewalls of fins 212A, 212B and a top surface of substrate 202, and oxide layer 224 (also referred to as a bulk dielectric and/or a bulk dielectric layer) is disposed over liner layer 222. In some embodiments, liner layer 222 is a dielectric liner (e.g., a silicon nitride liner and/or a silicon oxide liner). In some embodiments, liner layer 222 is a silicon liner. In some embodiments, liner layer 222 is a doped liner including, for example, boron silicate glass (BSG) and/or phosphosilicate glass (PSG)). In some embodiments, liner layer 222 and/or oxide layer 224 include multiple layers, such as a dielectric liner and a silicon liner or a first dielectric liner and a second dielectric liner. In some embodiments, oxide layer 224 includes silicon and oxygen (e.g., $SiO_2$) and can thus be referred to as a silicon oxide layer. In some embodiments, oxide layer 224 includes multiple layers. In some embodiments, forming isolation features 220 includes performing a first deposition process to form a liner layer over multigate device 200 that partially fills trenches defined by fins 212A, 212B, where the liner layer extends continuously over substrate 202 and fin structure 210 (e.g., the liner layer extends continuously over top surfaces of substrate 202, sidewalls of fins 212A, 212B, sidewalls of patterning layer 215, and top surfaces of patterning layer 215 without interruption); performing a second deposition process to form an oxide layer over the liner layer that fills remainders of the trenches, where the second deposition process overfills the trenches, such that a thickness of the oxide layer is greater than a height of fin structure 210 (e.g., the oxide layer is formed over top surfaces of patterning layer 215 and/or fins 212A, 212B); and performing a planarization process that removes any of the liner layer and/or the oxide layer that is disposed over and/or above top surfaces of fin structure 210. The first deposition process and the second deposition process can implement chemical vapor deposition (CVD), physical vapor deposition (PVD), atomic layer deposition (ALD), flowable CVD (FCVD), high density plasma CVD (HDPCVD), high aspect ratio deposition (HARP), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other deposition method, or combinations thereof. In some embodiments, the first deposition process implements ALD to form the liner layer, and the second deposition process implements FCVD, HDPCVD, and/or HARP to form the oxide layer. In some embodiments, the planarization process is a chemical mechanical polishing (CMP) process that removes excess liner layer and oxide layer and/or planarizes top surfaces of isolation features 220 and/or fins 212A, 212B. In the depicted embodiment, fins 212A, 212B function as a planarization stop layer, such that the planarization process removes patterning layer 215 disposed over fins 212A, 212B and is performed until reaching and exposing fins 212A, 212B. In some embodiments, top surfaces of isolation features 220 and top surfaces of fins 212A, 212B are substantially planar after the planarization process. Isolation features 220 can be configured as shallow trench isolation (STI) structures, deep trench isolation (DTI) structures, local oxidation of silicon (LOCOS) structures, and/or other suitable isolation structures.

Figure 5A:
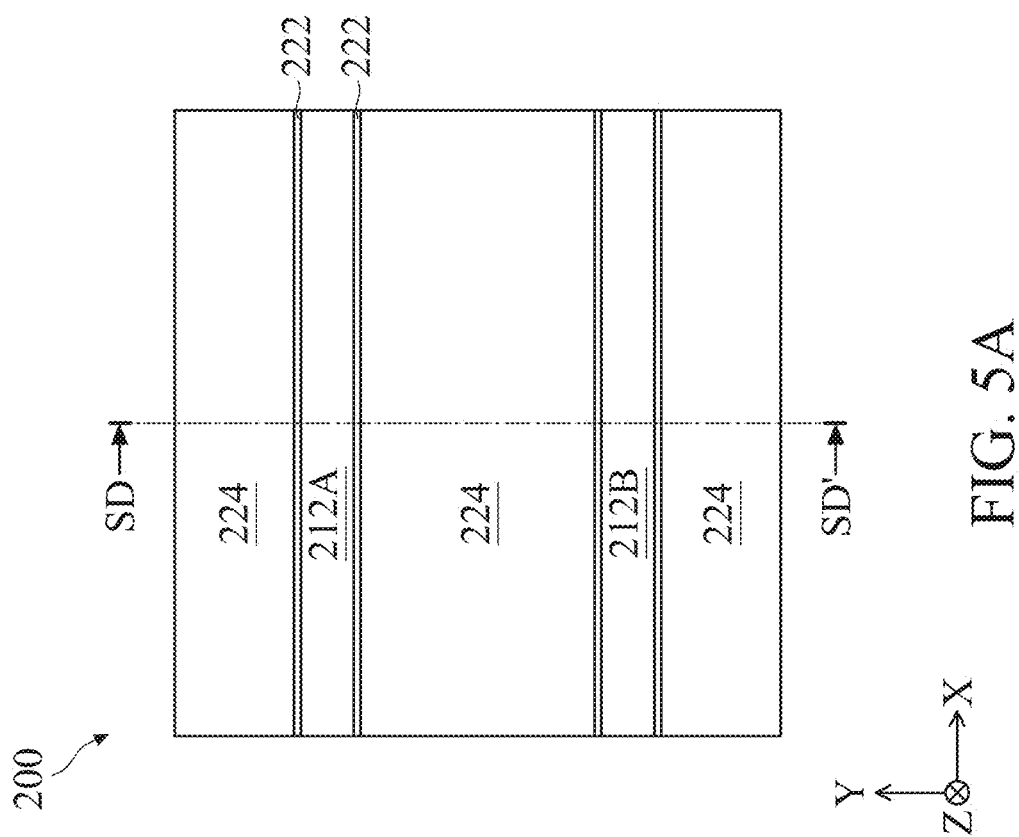
Figure 5B:
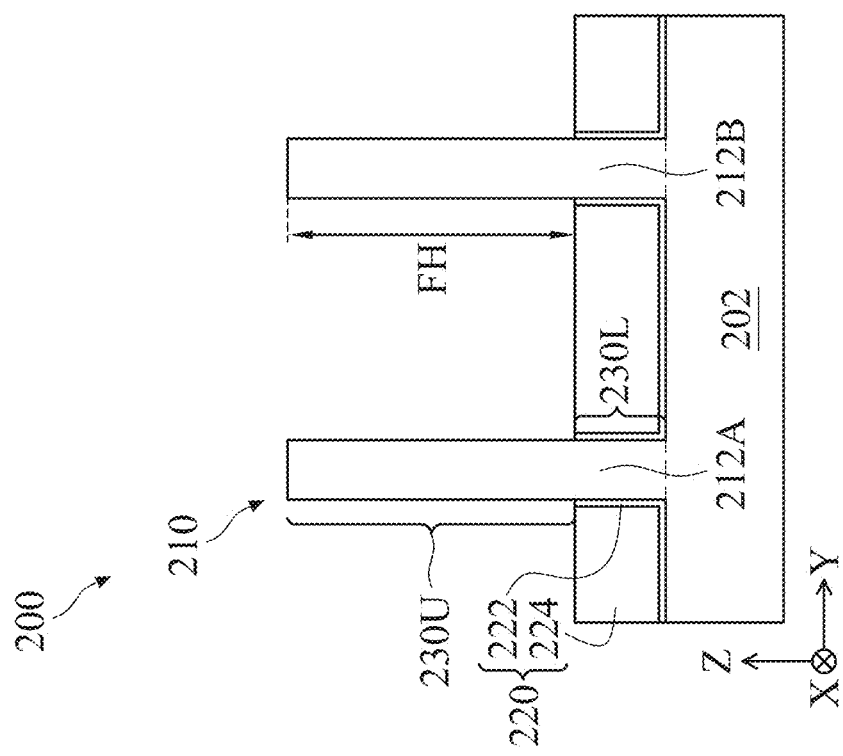

Turning to FIG. 5A and FIG. 5B, isolation features 220 are recessed (for example, by an etching process), such that fins 212A, 212B extend (protrude) from between isolation features 220. For example, isolation features 220 surround a bottom portion of fins 212A, 212B, thereby defining upper fin active regions 230U (generally referring to portions of fins 212A, 212B that extend from top surfaces of isolation features 220) and lower fin active regions 230L (generally referring to portions of fins 212A, 212B surrounded by isolation features 220, which extend from the top surface of substrate 202 to the top surfaces of isolation features 220). In some embodiments, an etching process recesses isolation features 220 until achieving a desired (target) height of upper fin active regions 230U. For example, a fin height FH of upper fin active regions 230U is defined between top surfaces of isolation features 220 and respective top surfaces of fins 212A, 212B along the z-direction. In some embodiments, fin height FH is about 40 nm to about 80 nm. The etching process is configured to selectively remove isolation features 220 with respect to fins 212A, 212B. In other words, the etching process substantially removes isolation features 220 but does not remove, or does not substantially remove, fins 212A, 212B. For example, an etchant is selected for the etch process that etches silicon-comprising dielectric materials (i.e., isolation features 220) at a higher rate than semiconductor materials (i.e., fins 212A, 212B) (i.e., the etchant has a high etch selectivity with respect to silicon-comprising dielectric materials (e.g., silicon oxide and/or silicon nitride). The etching process is a dry etching process, a wet etching process, or a combination thereof. Various parameters of the etch process can be tuned to achieve selective etching of isolation features 220, such as a flow rate of an etch gas, a concentration of the etch gas, a concentration of the carrier gas, a ratio of the concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etching process is a dry etching process, where a duration of the dry etching process is tuned to achieve a desired height of fin 212A and fin 212B (i.e., a timed dry etching process). In some embodiments, the etching process includes multiple steps (stages). In some embodiments, the etching process uses a patterned mask layer as an etch mask, where the patterned mask layer covers fins 212A, 212B but has openings therein that expose isolation features 220.

Turning to FIG. 6A and FIG. 6B, dummy gate stacks, such as a dummy gate stack 240A, a dummy gate stack 240B, and a dummy gate stack 240C, are formed over portions of fins 212A, 212B and over isolation features 220. Dummy gate stacks 240A-240C extend lengthwise in a direction that is different than (e.g., orthogonal to) the lengthwise direction of fins 212A, 212B. For example, dummy gate stacks 240A-240C extend substantially parallel to one another along the y-direction, having a length defined in the y-direction, a width defined in the x-direction, and a height defined in the z-direction. Fins 212A, 212B each have one or more channel regions (C) and source/drain (S/D) regions defined along their length (here, along the x-direction), where each channel region is disposed between respective source/drain regions. Dummy gate stacks 240A-240C are disposed between and interpose source/drain regions of fins 212A, 212B, where channel regions of fins 212A, 212B underlie dummy gate stacks 240A-240C. In the Y-Z plane, gate stacks 240A-240C wrap top surfaces and sidewall surfaces of upper fin active regions 230U of fins 212A, 212B. In the X-Z plane, gate stacks 240A-240C are disposed over top surfaces of respective channel regions of fins 212A, 212B. In FIG. 6A and FIG. 6B, dummy gate stack 240A is disposed over a respective channel region of fin 212A, dummy gate stack 240B is disposed over a respective channel region of 212B, and dummy gate stack 240C is disposed over a respective channel region of fin 212A and a respective channel region of fin 212B, where dummy gate stack 240C extends without interruption over fins 212A, 212B. Each of dummy stacks 240A-240C can include a dummy gate dielectric, a dummy gate electrode, and/or a hard mask. The dummy gate dielectric includes a dielectric material, such as silicon oxide, a high-k dielectric material, other suitable dielectric material, or combinations thereof. In some embodiments, the dummy gate dielectric includes an interfacial layer (including, for example, silicon oxide) and a high-k dielectric layer disposed over the interfacial layer. The dummy gate electrode includes a suitable dummy gate material, such as polysilicon. Dummy gate stacks 240A-240C can thus be referred to as poly (PO) gate stacks, in some embodiments. The hard mask layer incudes silicon oxide, silicon carbide, silicon nitride, other suitable hard mask material, or combinations thereof. In some embodiments, dummy gate stacks 240A-240C include numerous other layers, for example, capping layers, interface layers, diffusion layers, barrier layers, or combinations thereof.

Dummy gate stacks 240A-240C are formed by deposition processes, lithography processes, etching processes, other suitable processes, or combinations thereof. For example, a first deposition process is performed to form a dummy gate dielectric layer over multigate device 200, a second deposition process is performed to form a dummy gate electrode layer over the dummy gate dielectric layer, and a third deposition process is performed to form a hard mask layer over the dummy gate electrode layer. The deposition processes include CVD, PVD, ALD, HDPCVD, MOCVD, RPCVD, PECVD, LPCVD, ALCVD, APCVD, plating, other suitable methods, or combinations thereof. A gate patterning process (including, for example, various lithography processes, etching processes, and/or cleaning processes, such as those described herein) are then performed to pattern the hard mask layer, the dummy gate electrode layer, and/or the dummy gate dielectric layer to form dummy gate stacks 240A-240C as depicted in FIG. 6A and FIG. 6B. In some embodiments, the gate patterning process can include a gate cut process, which separates a dummy gate stack that extends over both fins 212A, 212B into discrete dummy gate stacks, each of which is disposed over either fin 212A or fin 212B, such as dummy gate stack 240A and dummy gate stack 240B. In some embodiments, the gate patterning process defines a target gate pitch (spacing) between dummy gate stacks, such as a spacing (or distance) between directly adjacent dummy gate stacks along the x-direction. For example, the gate patterning process defines gate pitches (spacings) between dummy gate stack 240C and dummy gate stack 240A and dummy gate stack 240B, respectively. The present disclosure contemplates any number of dummy gate stacks and/or configuration of dummy gate stacks, noting that dummy gate stacks 240A-240C are provided for illustration.

Turning to FIG. 7A and FIG. 7B, gate spacers 245 are formed along sidewalls of dummy gate stacks 240A-240C, thereby forming gate structures 250A-250C (which collectively refers to dummy gate stacks 240A-240C and gate spacers 245). Gate spacers 245 are disposed adjacent to (i.e., along sidewalls of) respective dummy gate stacks 240A-240C. Gate spacers 245 are formed by any suitable process and include a dielectric material. The dielectric material can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonnitride). For example, a dielectric layer including silicon and nitrogen (e.g., $Si_3N_4$), such as a silicon nitride layer, is deposited over multigate device 200 and etched (e.g., anisotropically etched) to form gate spacers 245. In some embodiments, gate spacers 245 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240A-240C. In such embodiments, the various sets of spacers can include materials having different etch rates. For example, a first dielectric layer including silicon and oxygen (e.g., silicon oxide) is deposited and etched to form a first spacer set adjacent to sidewalls of dummy gate stacks 240A-240C, and a second dielectric layer including silicon and nitrogen (e.g., silicon nitride) is deposited and etched to form a second spacer set adjacent to the first spacer set.

Turning to FIG. 8A and FIG. 8B (which collectively refers to FIG. 8B-1, FIG. 8B-2, and FIG. 8B-3), epitaxial source/drain features 255 are formed over source/drain regions of fins 212A, 212B. For example, a semiconductor material is epitaxially grown on and/or from source/drain regions of fins 212A, 212B to form epitaxial source/drain features 255. In some embodiments, such as depicted in FIG. 8B-1, a source/drain etch is performed on source/drain regions of fins 212A, 212B to form source/drain recesses and epitaxial source/drain features 255 are grown from on and/or from source/drain regions of fins 212A, 212B to fill the source/drain recesses. In the depicted embodiment, top surfaces of source/drain regions of fins 212A, 212B are below top surfaces of isolation features 220 relative to a top surface of substrate 202 after the source/drain etch. In some embodiments, the etching process completely removes source/drain regions of fins 212A, 212B to expose substrate 202. In some embodiments, top surfaces of source/drain regions of fins 212A, 212B are above and/or substantially planar with top surfaces of isolation features 220 after the source/drain etch. In some embodiments, the source/drain etch is configured to selectively etch fins 212A, 212B with minimal (to no) etching of gate structures 250A-250C and/or isolation features 220. In some embodiments, such as depicted in FIG. 8B-2 and FIG. 8B-3, epitaxial source/drain features 255 are epitaxially grown from source/drain regions of fins 212A, 212B without performing a source/drain etch. In such embodiments, epitaxial source/drain features 255 wrap source/drain regions of fins 212A, 212B (e.g., cover top surfaces and sidewalls of fins 212A, 212B). Epitaxial growth parameters can be controlled to achieve different profiles of epitaxial source/drain features 255, such as rectangular-shaped and/or square shaped profiles (FIG. 8B-2) or diamond-shaped profiles (FIG. 8B-3).

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 212A, 212B. Epitaxial source/drain features 255 are doped with n-type dopants and/or p-type dopants. In some embodiments, for n-type transistors, epitaxial source/drain features 255 include silicon, which can be doped with carbon, phosphorous, arsenic, other n-type dopant, or combinations thereof (for example, forming Si:C, Si:P, or Si:C:P epitaxial source/drain features). In some embodiments, for p-type transistors, epitaxial source/drain features 255 include silicon germanium, which can be doped with boron, other p-type dopant, or combinations thereof (for example, forming Si:Ge:B epitaxial source/drain features). In some embodiments, for p-type transistors, epitaxial source/drain features 255 include germanium, which can be doped with boron, gallium, indium, other p-type dopant, or combinations thereof (for example, forming Ge:B or Ge:Ga epitaxial source/drain features). In some embodiments, epitaxial source/drain features 255 include more than one epitaxial semiconductor layer, where the epitaxial semiconductor layers can include the same or different materials and/or dopant concentrations. In some embodiments, epitaxial source/drain features 255 include materials and/or dopants that achieve desired tensile stress and/or compressive stress in channel regions of transistors of multigate device 200. In some embodiments, epitaxial source/drain features 255 are doped during deposition by adding impurities to a source material of the epitaxy process (i.e., doped in-situ). In some embodiments, epitaxial source/drain features 255 are doped by an ion implantation process after the epitaxial growth. In some embodiments, annealing processes (e.g., rapid thermal annealing and/or laser annealing) are performed to activate dopants in remaining portions of fins 212A, 212B, epitaxial source/drain features 255, heavily doped source/drain (HDD) regions (which may be formed in remaining portions of fins 212A, 212B and/or epitaxial source/drain features), and/or lightly doped source/drain (LDD) regions (which may be formed in remaining portions of fins 212A, 212B and/or epitaxial source/drain features).

Turning to FIG. 9A, FIG. 9B (taken along line G-G' of FIG. 9A), and FIG. 9C (taken along line SD-SD' of FIG. 9A), a dielectric layer 260 is formed over epitaxial source/drain features 255, gate structures 250A-250C, isolation features 220, fins 212A, 212B, and substrate 202. Dielectric layer 260 is disposed between adjacent gate structures 250A-250C. Dielectric layer 260 can include an interlayer dielectric (ILD) layer disposed over a contact etch stop layer (CESL), where CESL is disposed between ILD layer and gate structures 250A-250C, isolation features 220, and fins 212A, 212B. ILD layer includes a dielectric material including, for example, silicon oxide, carbon doped silicon oxide, silicon nitride, silicon oxynitride, tetraethyl orthosilicate (TEOS), PSG, BSG, boron-doped phosphosilicate glass (BPSG), fluorine-doped silicate glass (FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other suitable dielectric material, or combinations thereof. In some embodiments, ILD layer includes a dielectric material having a dielectric constant that is less than a dielectric constant of silicon dioxide (e.g., k<3.9) (i.e., a low-k dielectric material). In some embodiments, ILD layer includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. CESL includes a material different than ILD layer, such as a dielectric material that is different than the dielectric material of ILD layer. ILD layer and/or CESL can include a multilayer structure having multiple dielectric materials. In the depicted embodiment, ILD layer includes silicon and oxygen (for example, SiCOH, SiOx, or other silicon-and-oxygen comprising material), CESL includes nitrogen and/or carbon (for example, SiN, SiCN, SiCON, SiON, SiC, SiCO, metal nitride, and/or metal carbonitride). Dielectric layer 260 is formed by a deposition process, such as CVD, FCVD, PVD, ALD, HDPCVD, MOCVD, RPCVD, PECVD, LPCVD, ALCVD, APCVD, PEALD, other suitable methods, or combinations thereof. In some embodiments, forming dielectric layer 260 includes depositing CESL over multigate device 200 by ALD and/or CVD, depositing ILD layer over CESL by FCVD, HARP, and/or HDP, and performing a CMP process and/or other planarization process until reaching (exposing) top surfaces) of dummy gate stacks 240A-240C. In some embodiments, the planarization process removes hard mask layers of dummy gate stacks 240A-240C to expose dummy gate electrodes of dummy gate stacks 240A-240C. In some embodiments, the planarization process provides ILD layer, CESL, and dummy gate stacks 240A-240C with substantially planar surfaces.

Turning to FIGS. 10A-12A and FIGS. 10B-12B, a gate replacement process is performed to replace dummy gate stacks 240A-240C with metal gate stacks. Turning to FIG. 10A and FIG. 10B, gate openings 265 are formed in gate structures 250A-250C by removing dummy gate stacks 240A-240C to expose channel regions of fins 212A, 212B. The etching process is configured to selectively remove dummy gate stacks 240A-240C with respect to dielectric layer 260, gate spacers 245, isolation features 220, and/or fins 212A, 212B. In other words, the etching process substantially removes dummy gate stacks 240A-240C but does not remove, or does not substantially remove, dielectric layer 260, gate spacers 245, isolation features 220, and/or fins 212A, 212B. For example, an etchant is selected for the etch process that etches polysilicon (i.e., dummy gate stacks 240A-240C) at a higher rate than semiconductor materials (i.e., fins 212A, 212B) and/or dielectric materials (i.e., dielectric layer 260, gate spacers 245, and/or isolation features 220), such as silicon-comprising semiconductor materials and/or silicon-comprising dielectric materials (i.e., the etchant has a high etch selectivity with respect to polysilicon). The etching process is a dry etching process, a wet etching process, or a combination thereof. Various parameters of the etch process can be tuned to achieve selective etching of dummy gate stacks 240A-240C, such as a flow rate of an etch gas, a concentration of the etch gas, a concentration of the carrier gas, a ratio of a concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etch process includes multiple steps. For example, the etching process may alternate etchants to separately remove various layers of dummy gate stacks 240A-240C. In some embodiments, the etching process uses a patterned mask layer as an etch mask, where the patterned mask layer covers dielectric layer 260 and/or gate spacers 245 but has openings therein that expose dummy gate stacks 240A-240C.

Figures 11A, 11B:
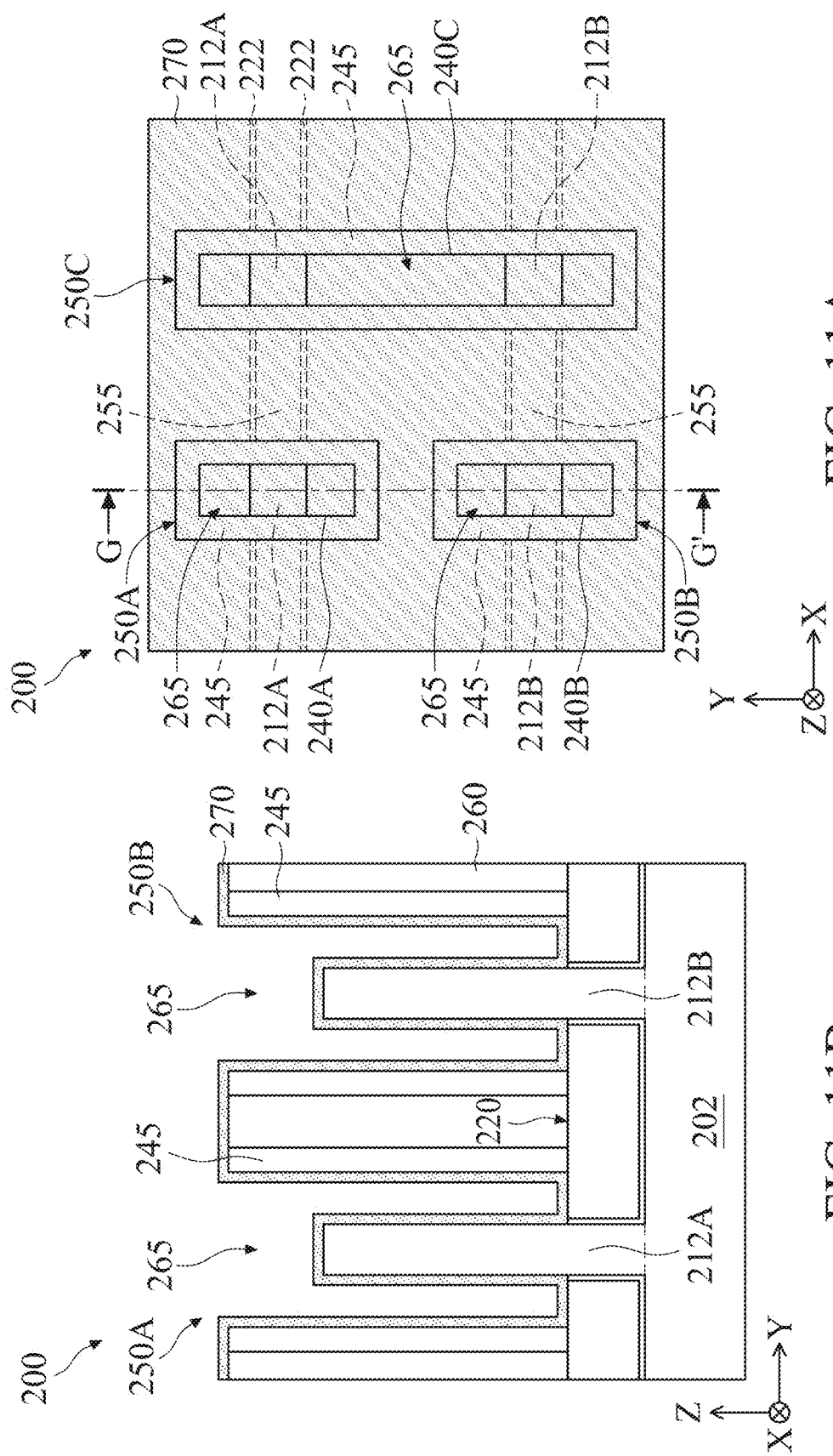

Turning to FIG. 11A and FIG. 11B, a gate dielectric layer 270 is formed over multigate device 200, where gate dielectric layer 270 partially fills gate trenches 265 and wraps channel regions of fins 212A, 212B. Gate dielectric layer 270 covers exposed surfaces of fins 212A, 212B, such that gate dielectric layer 270 is disposed along top surfaces and sidewalls of channel regions of fins 212A, 212B. In some embodiments, gate dielectric layer 270 is further disposed over isolation features 220 and dielectric layer 260. Gate dielectric layer 270 includes a high-k dielectric layer, which includes a high-k dielectric material, which generally refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, an ALD process deposits the high-k dielectric layer. In some embodiments, the ALD process is a conformal deposition process, such that a thickness of the high-k dielectric layer is substantially uniform (conformal) over the various surfaces of multigate device 200. In some embodiments, gate dielectric layer 270 includes an interfacial layer disposed between the high-k dielectric layer and fins 212A, 212B. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof. For example, the interfacial layer is formed by a chemical oxidation process that exposes exposed surfaces of fins 212A, 212B to hydrofluoric acid. In some embodiments, the interfacial layer is formed by a thermal oxidation process that exposes the exposed surfaces of fins 212A, 212B to an oxygen and/or air ambient. In some embodiments, the interfacial layer is formed after forming the high-k dielectric layer. For example, in some embodiments, after forming the high-k dielectric layer, multigate device 200 is annealed in an oxygen and/or nitrogen ambient (e.g., nitrous oxide).

Figures 12A, 12B:
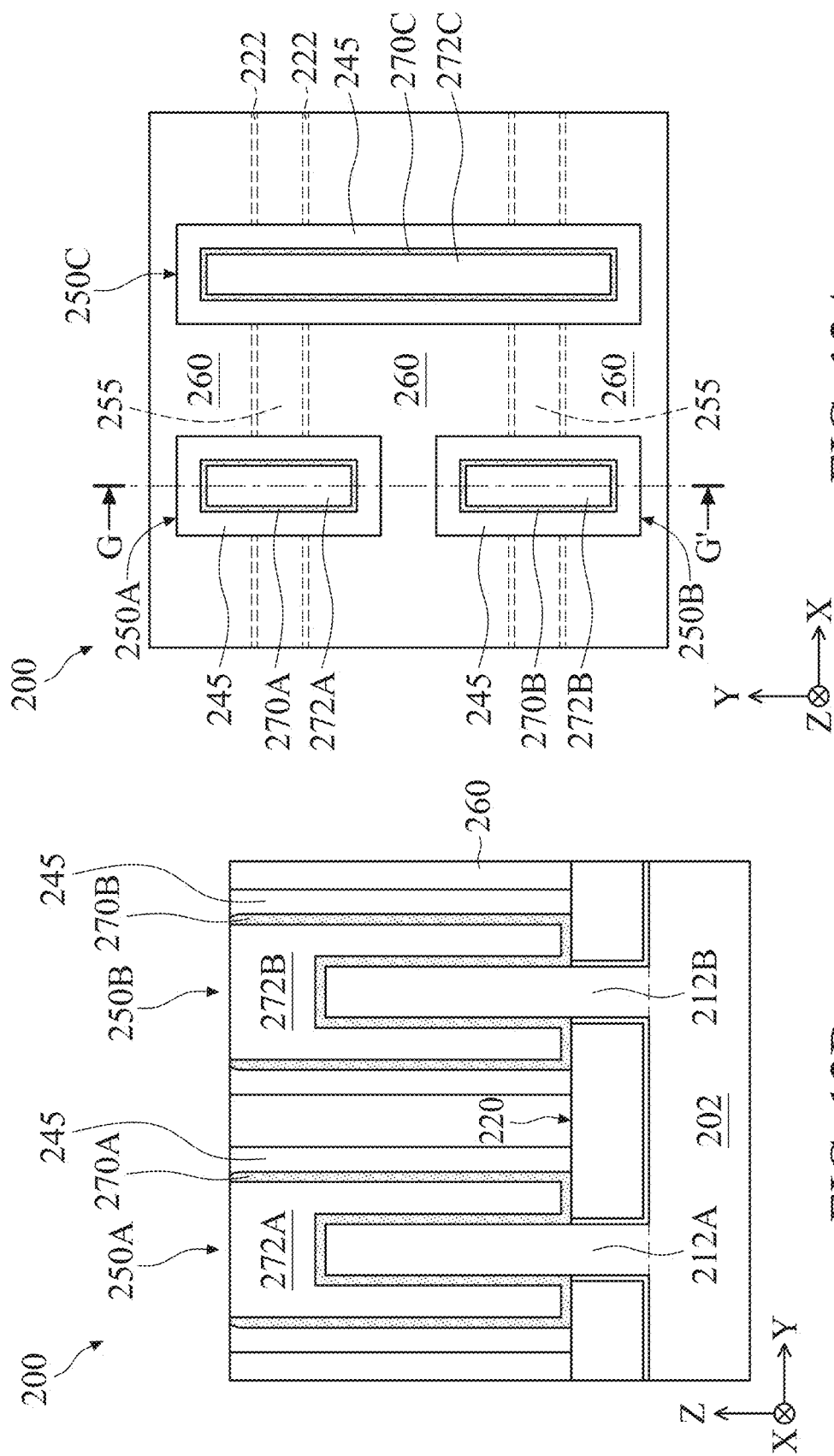

Turning to FIG. 12A and FIG. 12B, processing proceeds with forming metal gate stacks (also referred to as metal gates and/or high-k/metal gates) of gate structures 250A-250C. The metal gate stacks, each of which includes a respective gate dielectric and a respective gate electrode, are configured to achieve desired functionality according to design requirements of multigate device 200. In the depicted embodiment, a metal gate stack of gate structures 250A includes a gate dielectric 270A and a gate electrode 272A, a metal gate stack of gate structure 250B includes a gate dielectric 270B and a gate electrode 272B, and a metal gate stack of gate structure 250C includes a gate dielectric 270C and a gate electrode 272C. Gate electrodes 272A-272C are disposed over respective gate dielectrics 270A-270C and wrap respective channel regions of fins 212A, 212B. For example, gate electrodes 272A-272C are disposed along top surfaces and sidewalls of channel regions of fins 212A, 212B. In some embodiments, forming the metal gate stacks includes depositing a gate electrode layer over gate dielectric layer 270 (for example, by ALD, CVD, PVD, plating, other suitable process, or combinations thereof), where the gate electrode layer fills remainders of gate openings 265, and performing a planarization process to remove excess gate materials from multigate 200. For example, the planarization process removes portions of the gate electrode layer and gate dielectric layer 270 that are disposed over top surfaces of dielectric layer 260 and top surfaces of gate spacers 245, where remaining portions of the gate electrode layer and gate dielectric layer 270 fill gate openings 265 to form gate electrodes 272A-272C and gate dielectrics 270A-270C, providing metal gate stacks for gate structures 250A-250C. The metal gate stacks may include numerous other layers, such as capping layers, interface layers, diffusion layers, barrier layers, hard mask layers, or combinations thereof. In some embodiments, a CMP process is performed until a top surface of dielectric layer 260 is reached (exposed), such that top surfaces of gate structures 250A-250C are substantially planar with the top surface of dielectric layer 260.

Gate electrodes 272A-272C include conductive materials, such as polysilicon, aluminum, copper, titanium, tantalum, tungsten, molybdenum, cobalt, TaN, NiSi, CoSi, TiN, WN, TiAl, TiAlN, TiTaN, TaCN, TaC, TaSiN, other conductive material, or combinations thereof. In some embodiments, gate electrodes 272A-272C include a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Since gate structure 250C spans fins 212A, 212B, each of which may correspond with a different transistor region, gate structure 250C may have different layers in each transistor region. For example, a number, configuration, and/or materials of layers of gate dielectric 270C and/or gate electrode 272C corresponding with one transistor region (such as that corresponding with fin 212A) may be different than a number, configuration, and/or materials of layers of gate dielectric 270C and/or gate electrode 272C corresponding with another transistor region (such as that corresponding with fin 212B).

Figures 13A, 13B:
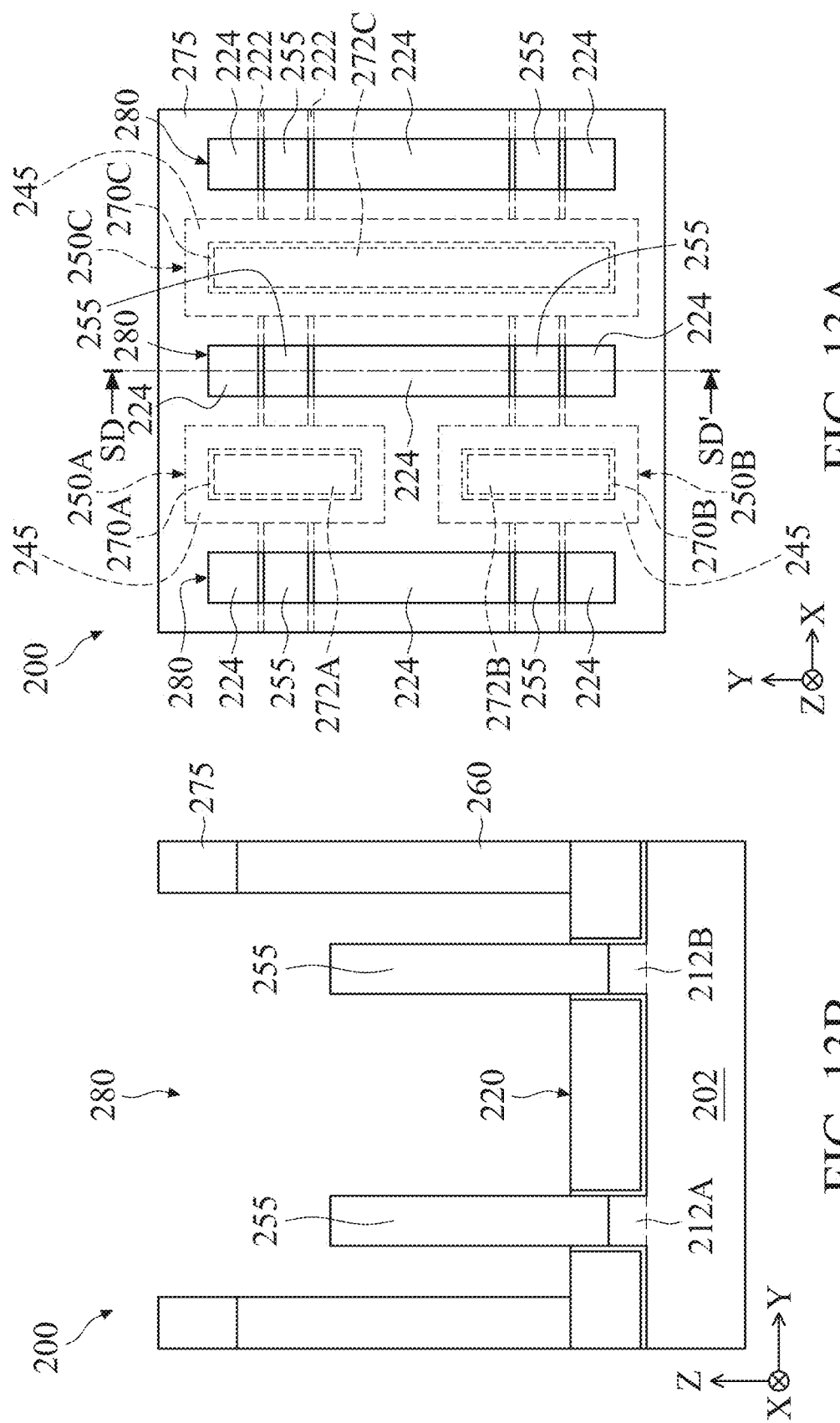

Turning to FIG. 13A and FIG. 13B, a dielectric layer 275 is formed over multigate device 200, and a patterning process is performed to form source/drain contact (plug) openings 280 that extend vertically through dielectric layer 275 and dielectric layer 260 to expose epitaxial source/drain features 255. Dielectric layer 275 is similar to dielectric layer 260 and can thus be configured and formed similar to dielectric layer 260, as described above. In some embodiments, the patterning process includes performing a lithography process to form a patterned mask layer over dielectric layer 275, where the patterned mask layer has an opening therein that exposes portions of dielectric layer 275 and dielectric layer 260 that cover epitaxial source/drain features 255, and performing an etching process to remove the exposed portions of dielectric layer 275 and dielectric layer 260 to expose epitaxial source/drain features 255. The lithography process can include forming a resist layer on dielectric layer 275 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the exposure process can be implemented or replaced by other methods, such as maskless lithography, electron-beam writing, and/or ion-beam writing. In some embodiments, the patterned resist layer is used as an etch mask during the etching process to remove the exposed portions of dielectric layer 275 and/or dielectric layer 260. In some embodiments, the patterned resist layer is formed over a mask layer formed over dielectric layer 275 before forming the resist layer, and the patterned resist layer is used as an etch mask to remove portions of the mask layer, thereby forming the patterned mask layer. In such embodiments, the patterned mask layer is used as an etch mask to remove the exposed portions of dielectric layer 275 and/or dielectric layer 260. The etching process can include a dry etching process (for example, a reactive ion etching (RIE) process), a wet etching process, other suitable etching process, or combinations thereof. In some embodiments, the etching process selectively etches dielectric layer 275 and/or dielectric layer 260 relative to the patterned mask layer, epitaxial source/drain features 255, and isolation features 220. In some embodiments, the patterned mask layer is removed from over dielectric layer 275 (for example, by a resist stripping process) after the etching process. In some embodiments, the patterned mask layer is removed by the etching process.

Turning to FIG. 14A and FIG. 14B, a deposition process is performed to form a doped amorphous layer 285 over multigate device 200, such that doped amorphous layer 285 partially fills source/drain contact openings 280. Doped amorphous layer 285 covers exposed surfaces of dielectric layer 260, epitaxial source/drain features 255, and isolation features 220. In the depicted embodiment, doped amorphous layer 285 wraps epitaxial source/drain features 255, such that doped amorphous layer 285 is disposed on top surfaces and sidewalls of epitaxial source/drain features 255. Doped amorphous layer 285 has a thickness t. In some embodiments, thickness t is about 1 nm to about 20 nm. In some embodiments, doped amorphous layer 285 is conformally deposited over multigate device 200, such that thickness t is substantially uniform over exposed surfaces of multigate device 200. For example, thickness t along sidewalls of dielectric layer 260 is substantially the same as thickness t along sidewalls of epitaxial source/drain feature 255 and/or thickness t along sidewalls of epitaxial source/drain features 255 is substantially the same as thickness t along top surfaces of epitaxial source/drain features 255. In some embodiments, thickness t of doped amorphous layer 285 varies over exposed surfaces of multigate device 200, such that doped amorphous layer 285 is not a conformal layer. Doped amorphous layer 285 includes a semiconductor material having a non-crystalline structure (in other words, a material having a disordered atomic structure), such as amorphous germanium, amorphous silicon, amorphous silicon germanium, and/or another amorphous semiconductor material. In some embodiments, doped amorphous layer 285 and epitaxial source/drain features 255 include the same material, but with different atomic structures. For example, doped amorphous layer 285 and epitaxial source/drain features 255 both include germanium, but doped amorphous layer 285 includes amorphous germanium (e.g., a-Ge) and epitaxial source/drain features 255 include crystalline germanium (e.g., c-Ge). In some embodiments, fins 212A, 212B include a semiconductor material having a crystalline structure (in other words, a material having an ordered atomic structure), such as crystalline silicon (e.g., c-Si), crystalline germanium, and/or crystalline silicon germanium (c-SiGe). Depending on design requirements of multigate device 200, doped amorphous layer 285 includes n-type dopants, p-type dopants, or combinations thereof. P-type dopants include boron (B), gallium (Ga), indium (In), other p-type dopant, or combinations thereof. N-type dopants include arsenic (As), phosphorus (P), antimony (Sb), other n-type dopant, or combinations thereof. In the depicted embodiment, doped amorphous layer 285 includes amorphous germanium doped with gallium and can thus be referred to as a gallium-doped amorphous germanium (a-Ge: Ga) layer.

The deposition process implemented for forming doped amorphous layer 285 is PVD, ALD, CVD, HDPCVD, MOCVD, RPCVD, PECVD, LPCVD, ALCVD, APCVD, plating, other suitable methods, or combinations thereof. Doped amorphous layer 285 is not formed using an ion implantation process (for example, where a semiconductor layer is bombarded with dopant ions, such as gallium ions, to form doped amorphous layer 285) because the present disclosure recognizes that ion implantation processes (and processing associated therewith) typically implemented to reduce contact resistivity are not compatible with fabrication of multigate devices, such as multigate device 200. In particular, high temperature annealing processes that are often needed after the ion implantation processes to activate dopants can damage a gate structure, such as a gate stack, of a multigate device, and/or unintentionally cause diffusion of dopants into a channel of the multigate device. Further, because of the three-dimensional geometry of source/drain regions of the multigate device, ions (dopants) from the ion implantation processes cannot uniformly reach both tops and bottoms of the source/drain regions, such that dopant concentrations at tops of the source/drain regions may be greater than dopant concentrations at the bottoms and/or along sidewalls of the source/drain regions, limiting reduction of contact resistivity. Furthermore, ion implantation processes often implement a resist layer (mask) to cover areas that should not be implanted by the ion implantation processes, and the resist layer (for example, because of its thickness) limits angles at which the ion implantation processes can implant dopants into the source/drain regions, resulting in non-uniformities in dopant concentrations in the source/drain regions of the multigate device. Instead, the present disclosure proposes forming doped amorphous layer 285 using an in-situ doping deposition process, where dopants are introduced into a semiconductor material as the semiconductor material is deposited over multigate device 200. In some embodiments, the deposition process is a low-temperature deposition process. For example, a wafer temperature during the deposition process is less than or equal to about 350° C. In some embodiments, doped amorphous layer 285 is formed by low-temperature PVD, where a temperature in a process chamber is about room temperature (e.g., about 20° C. to about 25° C.) to about 350° C. In some embodiments, the low-temperature PVD is a co-sputtering process, where at least a germanium-comprising target and a gallium-comprising target are bombarded with energetic ions (for example, of a plasma) to sputter germanium and gallium onto exposed surfaces of multigate device 200. In some embodiments, the co-sputtering process is a reactive magnetron sputtering process. In some embodiments, doped amorphous layer 285 is formed by a low-temperature ALD, where a temperature in a process chamber is about 150° C. to about 350° C. The low-temperature ALD uses a germanium-comprising precursor and a gallium-comprising precursor. In some embodiments, the germanium-comprising precursor is tetrakis(dimethylamino)germane (TDMAGe), other suitable germanium-comprising precursor, or combinations thereof. In some embodiments, the gallium-comprising precursor is gallium(III) acetylacetonate ($Ga(acac)_3$), gallium tris(dimethylamide) dimer $Ga_2(NMe_2)_6$, cyclo(trimido-hexamethyltrigallium) ($[(CH_3)_2GaNH_2]_3$), dimethylgallium isopropoxide ($Me_2GaOiPr$), gallium tris(isopropoxide) ($Ga(OiPr)_3$), trimethylgallium (TMGa), tris(2,2,6,6-tetramethyl-3,5-heptanedionato)gallium ($Ga(TMHD)_3$), other suitable gallium-comprising precursor, or combinations thereof. In some embodiments, the gallium-comprising precursor reacts with an oxygen-comprising precursor (which can be referred to as a reactant precursor) during the deposition process, such as $O_2$, $H_2O$, $O_3$, and/or $O_2$ plasma. For example, $Ga(acac)_3$ reacts with $H_2O$ and/or $O_3$. In another example, $Ga_2(NMe_2)_6$ reacts with $H_2O$. In another example, $[(CH_3)_2GaNH_2]_3$ reacts with $O_2$ plasma. In another example, $Me_2GaOiPr$ reacts with $H_2O$. In another example, $Ga(OiPr)_3$ reacts with $H_2O$. In another example, TMGa reacts with $O_3$ or $O_2$ plasma. In another example, $Ga(TMHD)_3$ reacts with $O_2$ plasma. In some embodiments, the deposition process is a nanolamination process, where doped amorphous layer 258 is a nanolaminate.

Figures 15A, 15B:
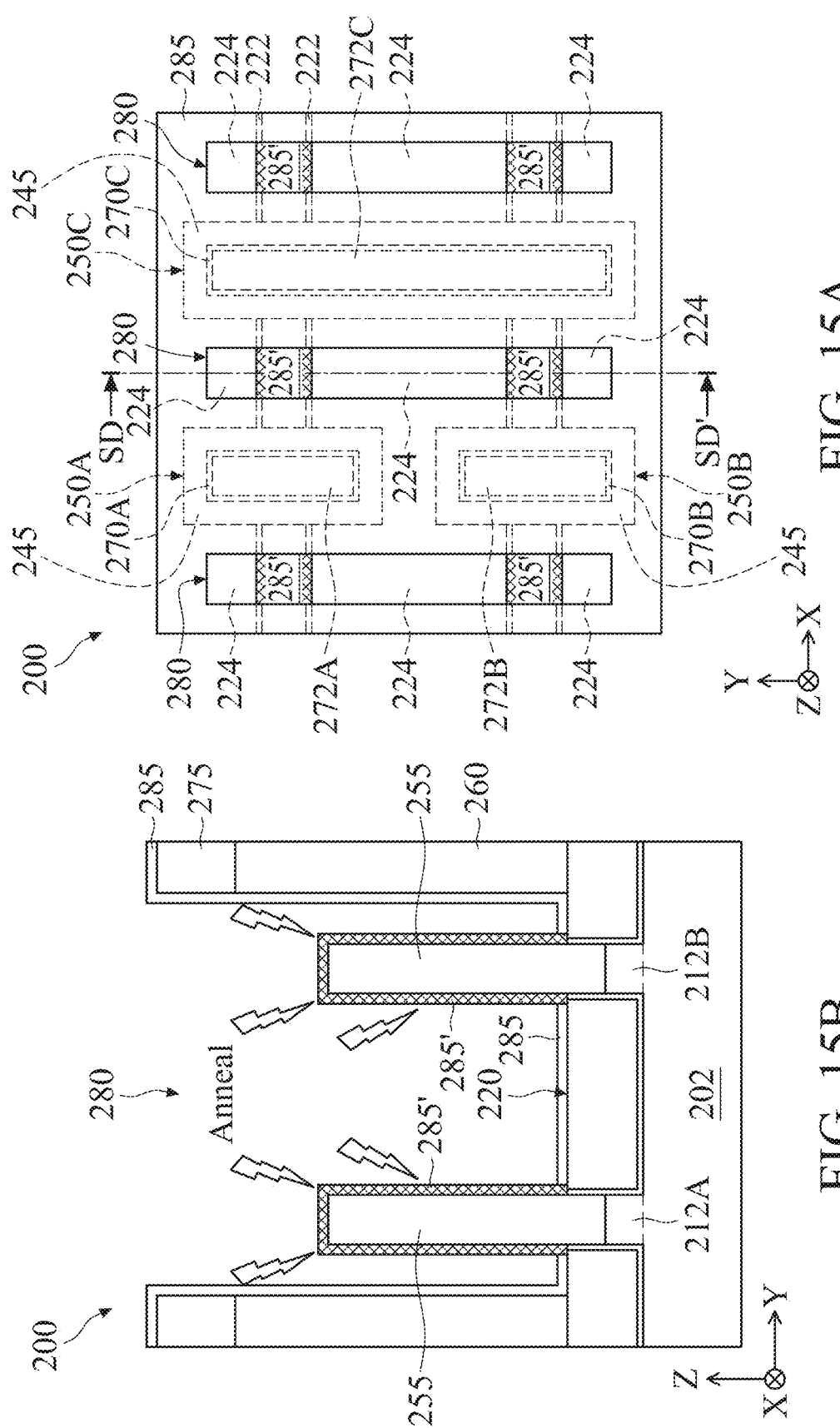

Turning to FIG. 15A and FIG. 15B, an annealing process is performed on doped amorphous layer 285 to convert (crystallize) the doped amorphous semiconductor material (i.e., semiconductor material having a non-crystalline structure) into doped crystalline semiconductor material (i.e., semiconductor material having a crystalline structure), thereby forming doped crystalline (crystallized) layer 285'. The annealing process crystallizes at least portions of doped amorphous layer 285 that are disposed over semiconductor surfaces, such as epitaxial source/drain features 255. In some embodiments, the annealing process crystallizes portions of doped amorphous layer 285 that are disposed over semiconductor surfaces, but not portions of doped amorphous layer 285 that are disposed over dielectric surfaces. In such embodiments, doped crystalline layer 285' is disposed over epitaxial source/drain features 255 while doped amorphous layer 285 remains disposed over dielectric layer 260 and/or isolation features 220. In some embodiments, the annealing process crystallizes portions of doped amorphous layer 285 that are disposed over dielectric layer 260 and/or isolation features 200. In some embodiments, the annealing process crystallizes an entirety of doped amorphous layer 285, such that doped crystalline layer 285' covers an entirety of multigate device 200 (i.e., epitaxial source/drain features 255, dielectric layer 260, and isolation features 220 in the depicted embodiment). Where doped amorphous layer 285 is a gallium-doped amorphous germanium layer, the annealing process crystallizes the gallium-doped amorphous germanium (in other words, reorders its atomic structure), such that doped crystalline layer 285' is a gallium-doped crystalline germanium layer (in other words, gallium-doped germanium having an ordered atomic structure). Any suitable annealing process is implemented so long as a temperature of the annealing process is sufficient to crystallize doped amorphous layer 285. In some embodiments, the annealing process is a laser annealing process, which provides localized heating of a material using a laser beam, which can activate dopant in doped crystalline layer 285' and/or doped amorphous layer 285. In some embodiments, the laser annealing process is a millisecond laser annealing process, which exposes doped amorphous layer 285 to laser pulses for millisecond (ms) time periods. In some embodiments, the millisecond laser annealing process exposes doped amorphous layer 285 to heat having a temperature of about 750° C. to about 900° C. In some embodiments, the laser annealing process is a nanosecond laser annealing process, which exposes doped amorphous layer 285 to laser pulses for nanosecond (ns) time periods. In some embodiments, the nanosecond laser annealing process exposes doped amorphous layer 285 to heat having a temperature greater than about 900° C.

The proposed deposition and annealing process, which provides doped crystalline layer 285' covering epitaxial source/drain features 255, has been observed to increase dopant levels at a metal-semiconductor interface, thereby reducing contact resistivity compared to contact resistivity exhibited by conventional metal-semiconductor contact interfaces. Further, performing the deposition and annealing process after the gate replacement process (in particular, during source/drain contact formation) prevents (or minimizes) deactivation of dopants in doped crystalline layer 285' during subsequent processing, ensuring integrity and preservation of the dopant levels needed for reducing contact resistivity. In some embodiments, a dopant concentration of a dopant, such as gallium, in doped crystalline layer 285' is about $1\times10^{20}$ dopants/cm$^3$ (cm$^{-3}$) to about $5\times10^{21}$ cm$^{-3}$. In some embodiments, doped crystalline layer 285' includes a dopant concentration, such as a gallium concentration, that is above solid solubility. For example, the dopant concentration, such as the gallium concentration, is greater than or equal to about $1\times10^{21}$ cm$^{-3}$. Dopant levels that are greater than dopant levels of a dopant's solid solubility, such as gallium's solid solubility, have been observed to achieve reductions in contact resistivity that are not possible by current source/drain contact fabrication techniques. In some embodiments, doped crystalline layer 285' has a contact resistivity (pc) that is less than about $1\times10^{-9}$ Ω-cm$^2$. In some embodiments, a dopant concentration of doped crystalline layer 285' is greater than a dopant concentration of epitaxial source/drain features 255 (and/or fins 212A, 212B, for example, in embodiments where multigate device 200 does not include epitaxial source/drain features 255). In some embodiments, doped amorphous layer 285 and epitaxial source/drain features 255 are doped with the same dopant (e.g., both Ga). In some embodiments, doped amorphous layer 285 and epitaxial source/drain features 255 are doped with different dopants (e.g., doped amorphous layer 285 is doped with Ga and epitaxial source/drain features 255 are doped with B). In some embodiments, doped amorphous layer 285 and/or epitaxial source/drain features 255 are doped with both Ga and B.

Figures 16A, 16B:
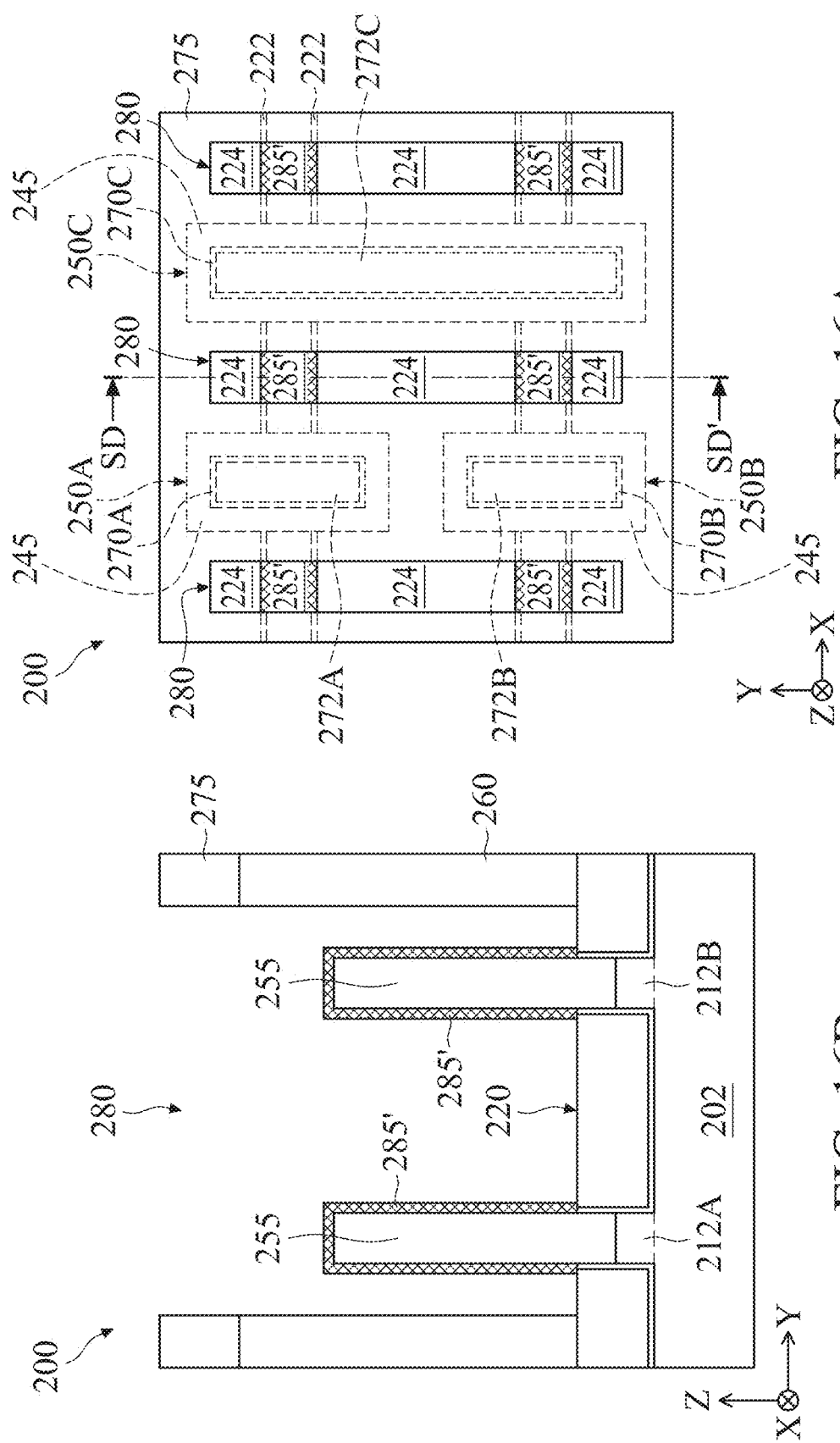

Turning to FIG. 16A and FIG. 16B, in some embodiments, any remaining portions of doped amorphous layer 285 can be removed from multigate device 200 by an etching process. For example, the etching process removes portions of doped amorphous layer 285 remaining over dielectric surfaces of multigate device 200, such as over dielectric layer 260 and/or isolation features 220. The etching process is configured to selectively remove doped amorphous layer 285 with respect to doped crystalline layer 285' and/or dielectric materials (e.g., dielectric layer 260 and/or isolation features 220). In other words, the etching process substantially removes doped amorphous layer 285 but does not remove, or does not substantially remove, doped crystalline layer 285'. For example, an etchant is selected for the etch process that etches doped amorphous semiconductor materials (i.e., doped amorphous layer 285) at a higher rate than doped crystalline semiconductor materials (i.e., doped crystalline layer 285') (i.e., the etchant has a high etch selectivity with respect to amorphous semiconductor materials (e.g., gallium-doped amorphous germanium). The etching process is a dry etching process, a wet etching process, or a combination thereof. Various parameters of the etch process can be tuned to achieve selective etching of doped amorphous layer 285, such as a flow rate of an etch gas, a concentration of the etch gas, a concentration of the carrier gas, a ratio of the concentration of a first etch gas to a concentration of a second etch gas, a ratio of the concentration of the carrier gas to the concentration of the etch gas, a concentration of a wet etch solution, a ratio of a concentration of a first wet etch constituent to a concentration of a second wet etch constituent in the wet etch solution, a power of an RF source, a bias voltage, a pressure, a duration of the etch process, a temperature maintained in a process chamber during the etch process, a temperature of a wafer during the etch process, a temperature of the wet etch solution, other suitable etch parameters, or combinations thereof. In some embodiments, the etching process is a dry etching process configured to etch gallium-doped amorphous germanium without, or minimally, etching gallium-doped crystalline germanium. In some embodiments, processing associated with FIG. 16A and FIG. 16B is omitted, such that multigate device 200 includes both doped crystalline layer 285' and any remaining portions of doped amorphous layer 285.

Figures 1, 17A, 17B:
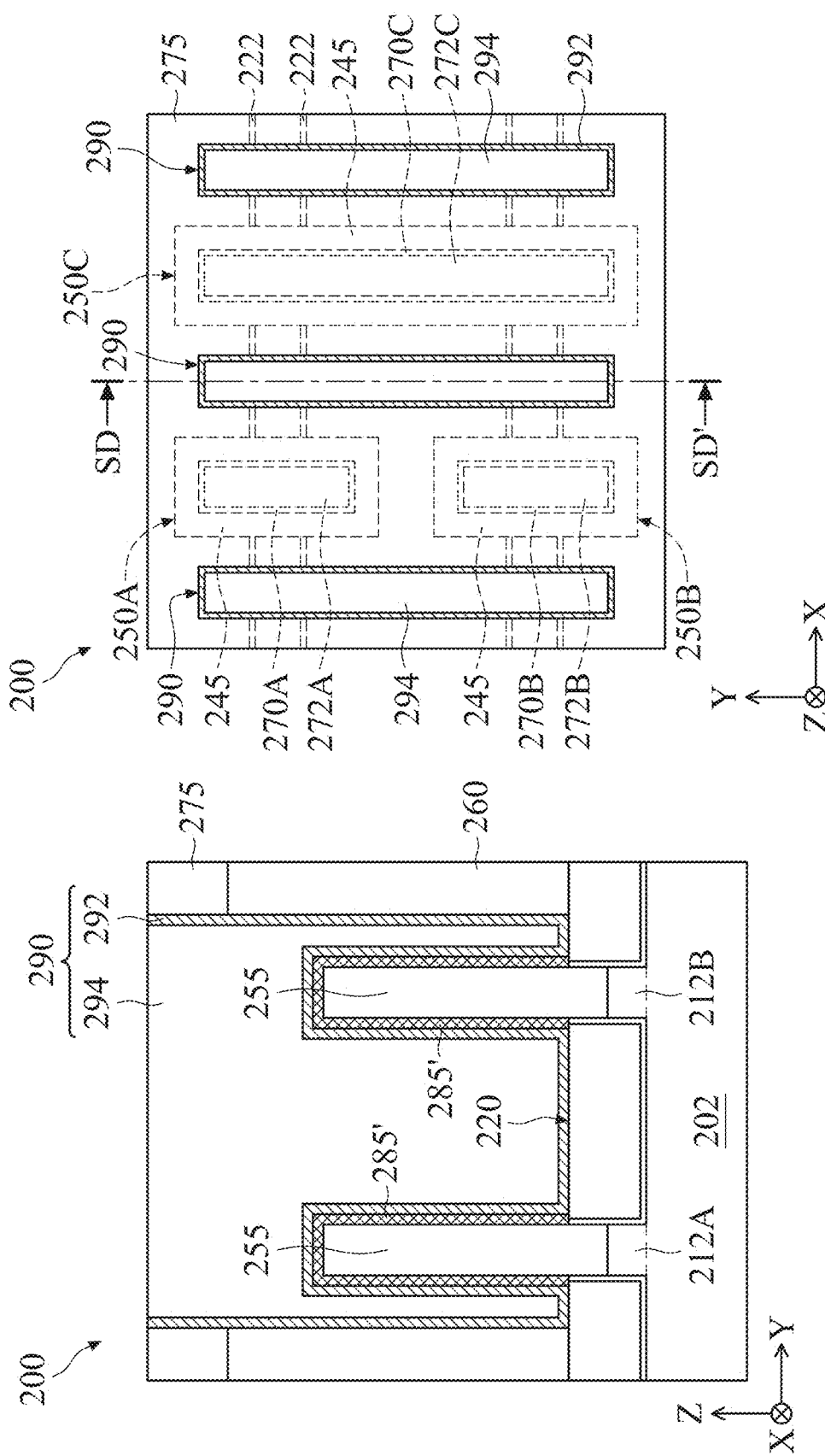
Figures 3, 17B:
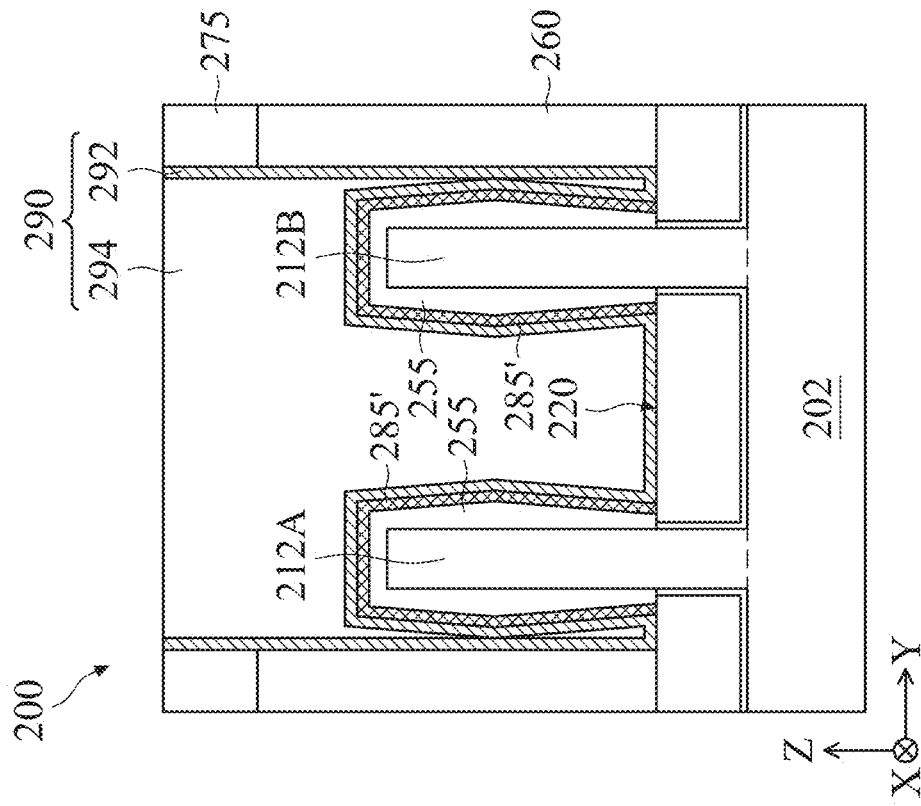
Figures 2, 17B:
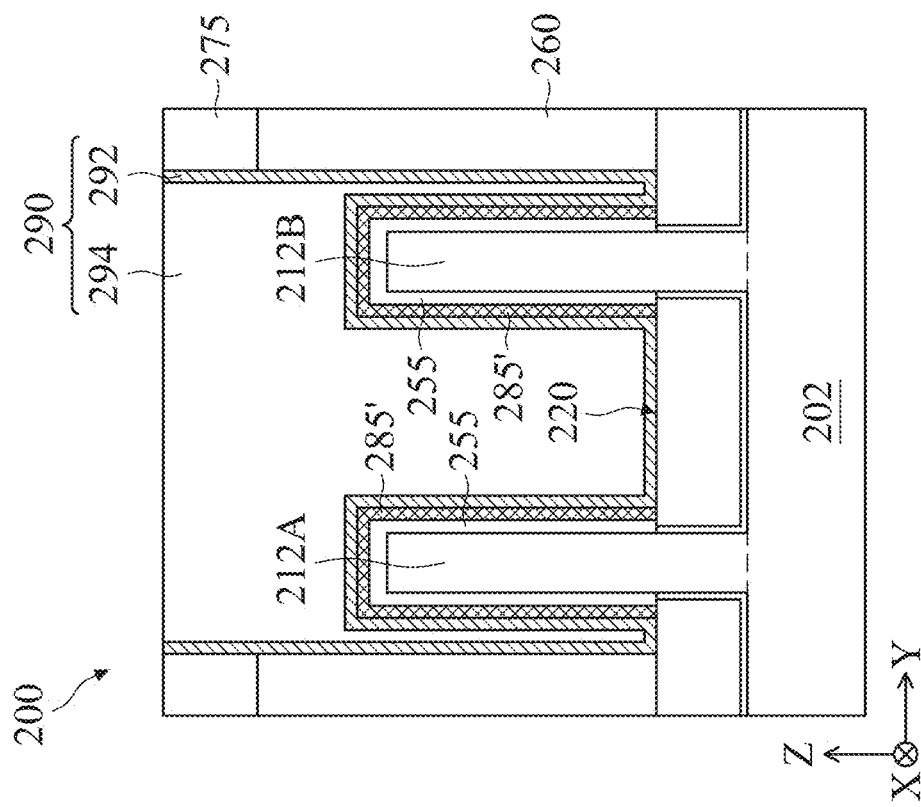

Turning to FIG. 17A and FIG. 17B (which collectively refers to FIG. 17B-1, FIG. 17B-2, and FIG. 17B-3), source/drain contacts 290 to epitaxial source/drain features 255 are formed in remainders of source/drain contact openings 280. Source/drain contacts 290 wrap respective epitaxial source/drain features 255 and are separated from their respective epitaxial source/drain features 255 by doped crystalline layer 285'. Each of source/drain contacts 290 includes a contact barrier (and/or liner) layer 292 and a contact bulk layer 294 disposed over contact barrier layer 292. Contact barrier layer 292 and contact bulk layer 294 each include one or more electrically conductive materials. In some embodiments, contact barrier layer 292 includes a material that promotes adhesion between a dielectric material (here, dielectric layer 260 and/or isolation features 220) and contact bulk layer 294 and between doped crystalline layer 285' and contact bulk layer 294. The material of contact barrier layer 292 may further prevent diffusion of metal constituents (for example, metal atoms/ions) source/drain contacts 290 into the surrounding dielectric material. In some embodiments, contact barrier layer 292 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 292 includes tantalum, tantalum nitride, tantalum aluminum nitride, tantalum silicon nitride, tantalum carbide, titanium, titanium nitride, titanium tantalum nitride, titanium silicon nitride, titanium aluminum, titanium aluminum nitride, titanium carbide, tungsten, tungsten nitride, tungsten carbide, molybdenum nitride, cobalt, cobalt nitride, ruthenium, palladium, or combinations thereof. In another example, contact barrier layer includes silicon doped with phosphorous. Contact bulk layer 294 includes tungsten, ruthenium, cobalt, copper, aluminum, iridium, palladium, platinum, nickel, low resistivity metal constituent, alloys thereof, or combinations thereof. In the depicted embodiment, contact bulk layer 294 include tungsten, ruthenium, and/or cobalt. In some embodiments, source/drain contacts 290 are formed by performing a first deposition process to form a contact barrier material over multigate device 200 that partially fills source/drain contact openings 280 and performing a second deposition process to form a contact bulk material over the contact barrier material, where the contact bulk material fills a remainder of source/drain contact openings 280. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. A CMP process and/or other planarization process is performed to remove excess contact bulk material and/or contact barrier material, for example, from over a top surface of dielectric layer 275, resulting in source/drain contacts 290 (i.e., contact barrier layer 292 and contact bulk layer 294). The CMP process can planarize source/drain contacts 290 and dielectric layer 275, such that the top surface of dielectric layer 275 and top surfaces of source/drain contacts 290 are substantially planar.

Source/drain contacts 290, dielectric layer 275, and dielectric layer 260 form a portion of a multi-layer interconnect (MLI) feature, in some embodiments. In some embodiments, dielectric layer 275 and dielectric layer 260 forms two bottommost layers of the MLI feature (e.g., ILD1 and ILD0, respectively). The MLI feature electrically couples various devices (for example, p-type transistors and/or n-type transistors of multigate device 200, resistors, capacitors, and/or inductors) and/or components (for example, gate electrodes and/or epitaxial source/drain features of p-type transistors and/or n-type transistors of multigate device 200), such that the various devices and/or components can operate as specified by design requirements of multigate device 200. In some embodiments, multigate device 200 has a first transistor that includes gate structure 250A disposed between respective epitaxial source/drain features 255 and wrapping a respective channel region of fin 212A, a second transistor that includes gate structure 250B disposed between respective epitaxial source/drain features 255 and wrapping a respective channel region of fin 212B, a third transistor that includes gate structure 250C disposed between respective epitaxial source/drain features 255 and wrapping a respective channel region of fin 212A, and a fourth transistor that includes gate structure 250C disposed between respective epitaxial source/drain features 255 and wrapping a respective channel region of fin 212B. At least one of the first transistor, second transistor, third transistor, or fourth transistor is a p-type transistor. In some embodiments, a p-type transistor includes an n-type channel disposed between p-type source/drain regions, where the n-type channel includes n-doped crystalline germanium or n-doped crystalline silicon (e.g., channel regions of fins 212A, 212B) and the source/drain regions include p-doped crystalline germanium or p-doped crystalline silicon germanium (in some embodiments, boron-doped and/or gallium-doped). In such embodiments, doped crystalline layer 285' includes gallium-doped crystalline germanium, which reduces contact resistivity for the p-type transistor, thereby reducing parasitic source/drain resistance and improving performance of the p-type transistor. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200. Fabrication can proceed with forming additional portions of the MLI feature, such as one or more gate contacts, vias, and/or conductive lines.

Figures 18A, 18B:
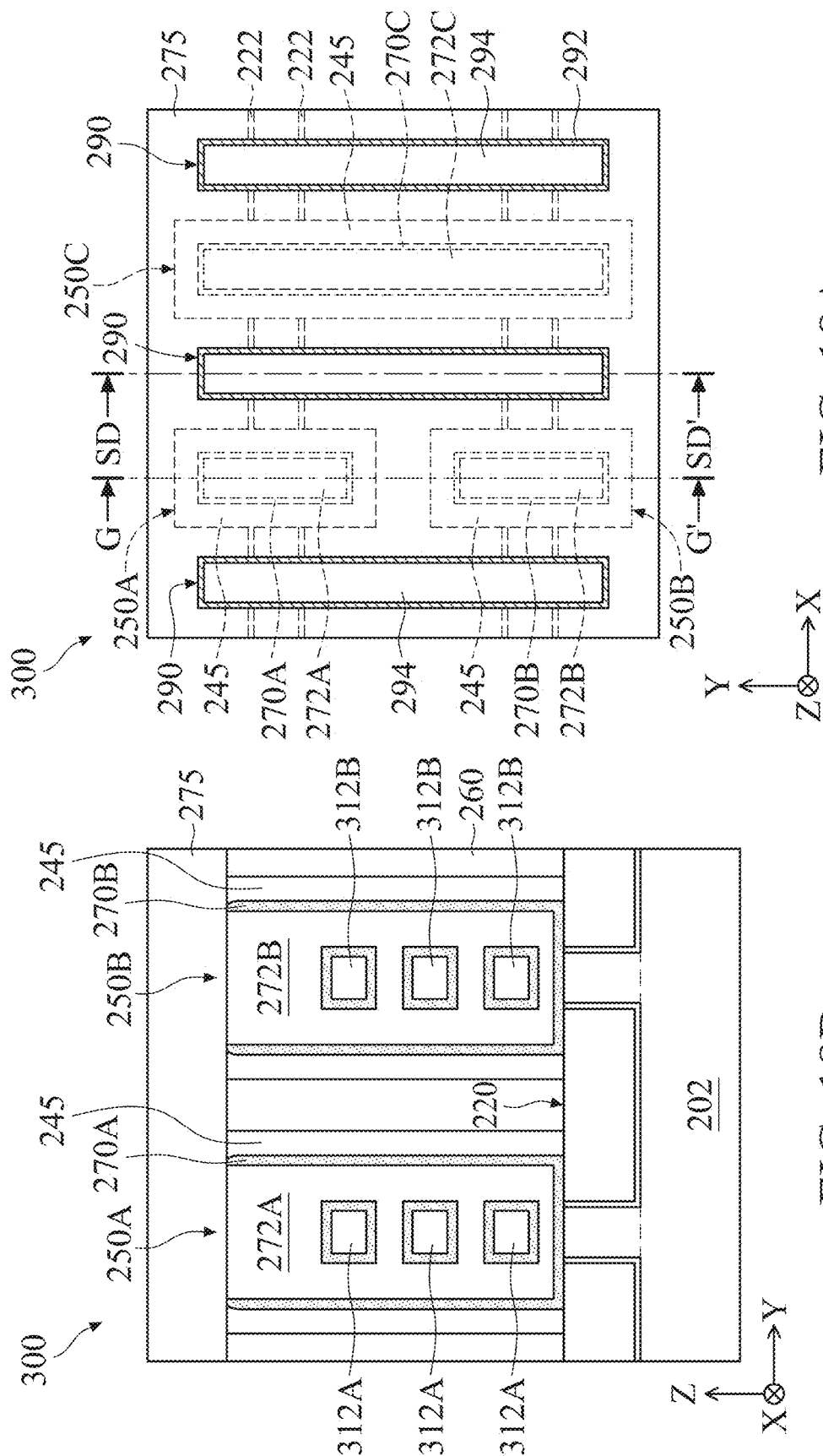
Figures 1, 18C:
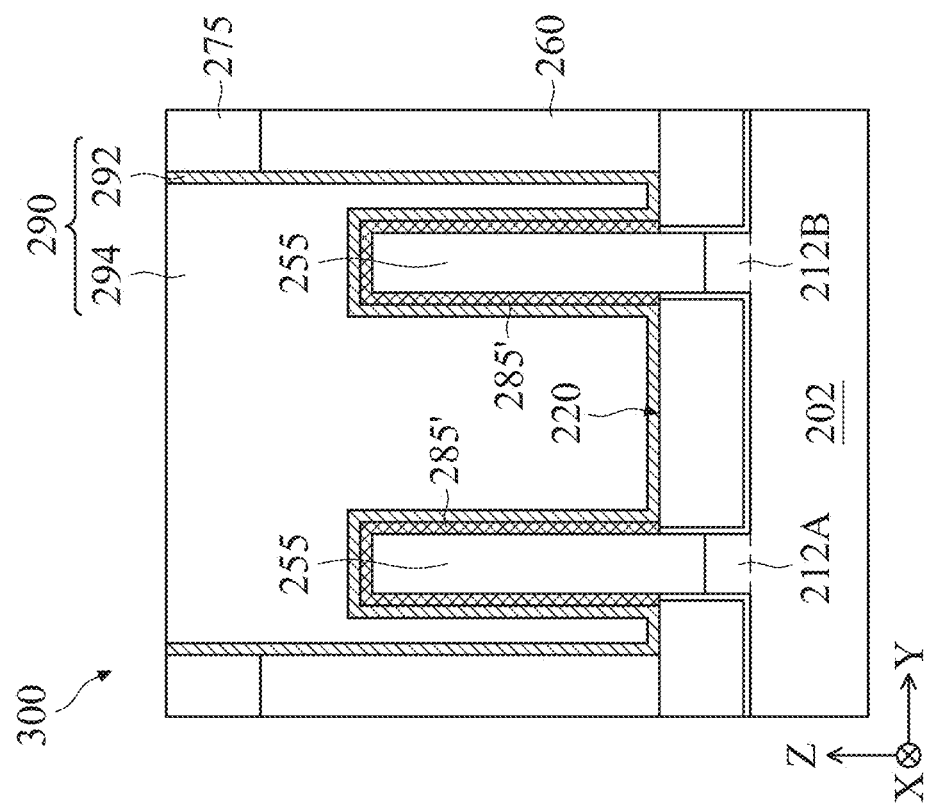

In some embodiments, where one or more transistors of multigate device 200 are configured as gate-all-around (GAA), metal gate stacks of gate structures 250A-250C (i.e., gate electrodes 272A-272C and gate dielectrics 270A-270C) are disposed along top surfaces, bottom surfaces, and sidewalls of channel layers of the transistors. For example, turning to FIGS. 18A-18C (of which FIG. 18B collectively refers to FIG. 18C-1, FIG. 18C-2, and FIG. 18C-3) are fragmentary perspective views of a multigate device 300, in portion or entirety, that can be fabricated using the method for fabricating the source/drain contact of FIG. 1 according to various aspects of the present disclosure. In such embodiments, before performing the fin fabrication process at FIG. 3, a semiconductor layer stack is formed over substrate 202 and fins 212A and fins 212B each include a semiconductor layer stack. In furtherance of such embodiments, during the gate replacement process, before forming gate dielectric layer 270, a channel release process is performed to selectively remove first layers of the semiconductor layer stacks relative to second layers of the semiconductor layer stacks, leaving the second layers of the semiconductor layer stacks of fins 212A, 212B suspended over substrate 202 in channel regions of the GAA. For example, in FIGS. 18A-18C, semiconductor layers 312A and semiconductor layers 312B (both of which can be referred to as suspended channel layers) are suspended over substrate 202. Accordingly, the metal gate stacks (here, gate electrodes 272A-272C and gate dielectrics 270A-270C) surround semiconductor layers 312A, 312B. In some embodiments, the metal gate stacks partially surround the semiconductor layers 312A, 312B. In furtherance of such embodiments, when forming epitaxial source/drain features 255, the semiconductor layer stacks of fins 212A, 212B can be subjected to a source/drain etch similar to when forming a FinFET, and thus source/drain regions of the GAA are similar to source/drain regions of the FinFET as depicted in FIG. 18C-1. In some embodiments, a source/drain a channel release process is performed to selectively remove first layers of the semiconductor layer stacks relative to second layers of the semiconductor layer stacks, leaving the second layers of the semiconductor layer stacks of fins 212A, 212B suspended over substrate 202 in source/drain regions of the GAA. For example, semiconductor layers 312A and semiconductor layers 312B can also be suspended over substrate 202 in the source/drain regions of the GAA as depicted in FIG. 18C-2 or FIG. 18C-3. In such embodiments, epitaxial source/drain features 255 surrounding suspended semiconductor layers 312A, 312B in source/drain regions of the GAA may be merged together, such as depicted in FIG. 18C-2, or not merged together, such as depicted in FIG. 18C-3. Accordingly, in the GAA, doped crystalline layers 285 can wrap epitaxial source/drain features 255 and suspended semiconductor layers 312A, 312B as depicted in FIG. 18C-2, or surround epitaxial source/drain features 255 and suspended semiconductor layers 312A, 312B as depicted in FIG. 18C-3. The present disclosure contemplates other configurations of epitaxial source/drain features 255 and doped crystalline layer 285' depending on design considerations of multigate device 300. The present disclosure further contemplates embodiments where multigate devices 300 do not include epitaxial source/drain features 255, such that doped crystalline layer 285' is disposed directly on and physically contacts suspended semiconductor layers 312A, 312B. In some embodiments, in FIG. 18C-2 and FIG. 18C-3, multigate devices 300 do not include epitaxial source/drain features 255 and doped crystalline layer 285' is disposed directly on suspended semiconductor layers 312A, 312B in source/drain regions of the GAA. In such embodiments, doped crystalline layer 285' surrounds suspended semiconductor layers 312A, 312B. In furtherance of such embodiments, doped crystalline layer 285' surrounding suspended semiconductor layers 312A, 312B may be merged together between suspended semiconductor layers 312A, 312B or not merged together between suspended semiconductor layers 312A, 312B depending on design and/or process considerations.

From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments. The present disclosure provides for many different embodiments. An exemplary device includes a channel layer, a first epitaxial source/drain feature, and a second epitaxial source/drain feature disposed over a substrate. The channel layer is disposed between the first epitaxial source/drain feature and the second epitaxial source/drain feature. The device further includes a metal gate disposed between the first epitaxial source/drain feature and the second epitaxial source/drain feature. The metal gate is disposed over and physically contacts at least two sides of the channel layer. The device further includes a source/drain contact disposed over the first epitaxial source/drain feature. The device further includes a doped crystalline semiconductor layer disposed between the first epitaxial source/drain feature and the source/drain contact. The doped crystalline semiconductor layer is disposed over and physically contacts at least two sides of the first epitaxial source/drain feature. In some embodiments, the doped crystalline semiconductor layer is a gallium-doped crystalline germanium layer. In some embodiments, the doped crystalline semiconductor layer has a contact resistivity ($\rho c$) that is less than about $1 \times 10^{-9}$ $\Omega\text{-cm}^2$. In some embodiments, the doped crystalline semiconductor layer includes a p-type dopant and is free of carbon. In some embodiments, the channel layer is a channel region of a semiconductor fin extending from the substrate and the metal gate wraps the fin, the first epitaxial source/drain feature wraps a first source/drain region of the semiconductor fin, the second epitaxial source/drain feature wraps a second source/drain region of the semiconductor fin, and the doped crystalline semiconductor layer wraps the first epitaxial source/drain feature. In some embodiments, the channel layer is a channel region of a semiconductor fin extending from the substrate and the metal gate wraps the fin, the first epitaxial source/drain feature is disposed over a first source/drain region of the semiconductor fin, the second epitaxial source/drain feature is disposed over a second source/drain region of the semiconductor fin, and the doped crystalline semiconductor layer wraps the first epitaxial source/drain feature.

In some embodiments, the channel layer is a channel region of a suspended semiconductor layer disposed over the substrate. In such embodiments, the metal gate surrounds the channel region of the suspended semiconductor layer. In such embodiments, the first epitaxial source/drain feature surrounds a first source/drain region of the suspended semiconductor layer, the second epitaxial source/drain feature surrounds a second source/drain region of the suspended semiconductor layer, and the doped crystalline semiconductor layer wraps the first epitaxial source/drain feature and the first source/drain region of the suspended semiconductor layer. In some embodiments, the channel layer is a channel region of a suspended semiconductor layer disposed over the substrate. In such embodiments, the metal gate surrounds the channel region of the suspended semiconductor layer. In such embodiments, the first epitaxial source/drain feature surrounds a first source/drain region of the suspended semiconductor layer and the second epitaxial source/drain feature surrounds a second source/drain region of the suspended semiconductor layer, and the doped crystalline semiconductor layer surrounds the first epitaxial source/drain feature and the first source/drain region of the suspended semiconductor layer.

Another exemplary device includes an n-type channel layer, a first p-type epitaxial source/drain feature, and a second p-type epitaxial source/drain feature disposed over a substrate. The n-type channel layer is disposed between the first p-type epitaxial source/drain feature and the second p-type epitaxial source/drain feature. A metal gate is disposed between the first p-type epitaxial source/drain feature and the second p-type epitaxial source/drain feature. The metal gate is disposed over and physically contacts at least two sides of the n-type channel layer. A first gallium-doped crystalline germanium layer is disposed over and physically contacts at least two sides of the first p-type epitaxial source/drain feature and a second gallium-doped crystalline germanium layer is disposed over and physically contacting at least two sides of the second p-type epitaxial source/drain feature. The first gallium-doped crystalline germanium layer separates the first p-type epitaxial source/drain feature from a first source/drain contact and the second gallium-doped crystalline germanium layer separates the second p-type epitaxial source/drain feature from a second source/drain contact. In some embodiments, the first p-type epitaxial source/drain feature and the second p-type epitaxial source/drain feature each include p-doped crystalline germanium. In such embodiments, a first dopant concentration of gallium in the first gallium-doped crystalline germanium layer and the second gallium-doped crystalline germanium layer is greater than a second dopant concentration of a p-type dopant in the first p-type epitaxial source/drain feature and the second p-type epitaxial source/drain feature. In some embodiments, the first p-type epitaxial source/drain feature is disposed over a first source/drain region of a fin, the second p-type epitaxial source/drain feature is disposed over a second source/drain region of the fin, and the fin includes p-doped crystalline silicon. In some embodiments, the first p-type epitaxial source/drain feature is disposed over a first source/drain region of a fin, the second p-type epitaxial source/drain feature is disposed over a second source/drain region of the fin, and the fin includes p-doped crystalline germanium. In some embodiments, the n-type channel layer includes n-doped crystalline germanium. In some embodiments, the n-type channel layer includes n-doped crystalline silicon. In some embodiments, the first gallium-doped crystalline germanium layer and the second gallium-doped crystalline germanium layer are each free of carbon.

An exemplary method includes forming a source/drain contact opening in a dielectric layer that exposes a source/drain feature of a multigate device; performing a deposition process to form a doped amorphous semiconductor layer over the multigate device, wherein the doped amorphous semiconductor layer partially fills the source/drain contact opening and wraps the source/drain feature of the multigate device; performing an annealing process to crystallize at least portions of the doped amorphous semiconductor layer that wrap the source/drain feature, thereby forming a doped crystallized semiconductor layer that wraps the source/drain feature of the multigate device; and forming a source/drain contact in a remainder of the source/drain contact opening. In some embodiments, depositing the amorphous layer includes performing an atomic layer deposition process that implements a gallium precursor. In some embodiments, depositing the amorphous layer includes performing a physical vapor deposition process that implements a gallium target. In some embodiments, the method further includes removing remaining portions of the doped amorphous semiconductor layer from over the multigate device before forming the source/drain contact in the remainder of the source/drain contact opening. In some embodiments, the performing the annealing process includes performing a laser annealing process. In some embodiments, the source/drain contact opening is formed after performing a gate replacement process, where a dummy gate is replaced with a metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
  a metal-comprising layer disposed in an interlevel dielectric (ILD) layer;
  in a cross-sectional view along a gate lengthwise direction, a semiconductor-comprising structure disposed in and coupled to the metal-comprising layer, wherein the semiconductor-comprising structure includes:
    a doped epitaxial layer, wherein sidewalls of the doped epitaxial layer have upper portions and lower portions, the metal-comprising layer is disposed over a top of the doped epitaxial layer, and the metal-comprising layer is disposed over the upper portions of the sidewalls of the doped epitaxial layer, and
    a doped semiconductor layer disposed between the metal-comprising layer and the top of the doped epitaxial layer and between the metal-comprising layer and the upper portions of the sidewalls of the doped epitaxial layer; and
  a substrate isolation structure disposed over the lower portions of the sidewalls of the doped epitaxial layer, wherein the doped semiconductor layer is not disposed between the substrate isolation structure and the lower portions of the sidewalls of the doped epitaxial layer.

2. The semiconductor structure of claim 1, wherein:
  the doped epitaxial layer has a first thickness; and
  the doped semiconductor layer has a second thickness less than the first thickness.

3. The semiconductor structure of claim 1, wherein:
  the doped epitaxial layer has a first thickness; and
  the doped semiconductor layer has a second thickness about equal to the first thickness.

4. The semiconductor structure of claim 1, wherein the substrate isolation structure is a shallow trench isolation structure.

5. The semiconductor structure of claim 1, wherein in the cross-sectional view along the gate lengthwise direction, the metal-comprising layer is disposed over an entirety of the upper portions of the sidewalls of the doped epitaxial layer and the doped semiconductor layer is disposed between the metal-comprising layer and the entirety of the upper portions of the sidewalls of the doped epitaxial layer.

6. The semiconductor structure of claim 1, wherein the semiconductor-comprising structure is a first semiconductor-comprising structure, the doped epitaxial layer is a first doped epitaxial layer, and the doped semiconductor layer is a first doped semiconductor layer, the semiconductor structure further including:
  in the cross-sectional view along the gate lengthwise direction, a second semiconductor-comprising structure disposed in and coupled to the metal-comprising layer, wherein the second semiconductor-comprising structure includes:
    a second doped epitaxial layer, wherein the metal-comprising layer is disposed over a top and sidewalls of the second doped epitaxial layer, and
    a second doped semiconductor layer disposed between the metal-comprising layer and the top of the second doped epitaxial layer and between the metal-comprising layer and the sidewalls of the second doped epitaxial layer, wherein the metal-comprising layer extends from the first doped semiconductor layer to the second doped semiconductor layer.

7. The semiconductor structure of claim 1, wherein the semiconductor-comprising structure further includes a semiconductor extension, wherein the doped epitaxial layer is disposed over a top and sidewalls of the semiconductor extension.

8. The semiconductor structure of claim 1, wherein:
  the doped epitaxial layer is a p-type doped silicon germanium epitaxial layer; and
  the doped semiconductor layer is a gallium-doped germanium layer.

9. The semiconductor structure of claim 1, wherein:
the doped epitaxial layer is a p-type doped germanium epitaxial layer; and
the doped semiconductor layer is a gallium-doped germanium layer.

10. The semiconductor structure of claim 1, wherein a thickness of the doped semiconductor layer disposed between the metal-comprising layer and the top of the doped epitaxial layer is the same as a thickness of the doped semiconductor layer disposed between the metal-comprising layer and the sidewalls of the doped epitaxial layer.

11. A method comprising:
forming an opening in an interlevel dielectric (ILD) layer, wherein the opening in the ILD layer exposes a doped epitaxial layer;
performing an in-situ doping deposition process, an annealing process, and an etching process to form a doped semiconductor layer over the doped epitaxial layer, wherein the doped semiconductor layer partially fills the opening; and
forming a metal-comprising structure that fills a remainder of the opening, wherein the metal-comprising structure is disposed over a top and sidewalls of the doped epitaxial layer and the doped semiconductor layer is disposed between the metal-comprising structure and the top of the doped epitaxial layer and between the metal-comprising structure and the sidewalls of the doped epitaxial layer.

12. The method of claim 11, wherein:
the deposition process forms a doped semiconductor material having first characteristics;
the annealing process provides the doped semiconductor material with a first portion having the first characteristics and a second portion having second characteristics different than the first characteristics, wherein the second portion is disposed on the top and the sidewalls of the doped epitaxial layer and the first portion is disposed on the ILD layer; and
the etching process selectively removes the first portion relative to the second portion.

13. The method of claim 12, wherein:
the first portion having the first characteristics has an amorphous structure; and
the second portion having the second characteristics has a crystalline structure.

14. The method of claim 11, wherein the in-situ doping deposition process implements a deposition temperature that is less than about 350° C.

15. The method of claim 11, further comprising performing a gate replacement process before forming the doped semiconductor layer.

16. A method comprising:
performing a first deposition process to form a first doped semiconductor layer;
after performing a gate replacement process and forming an opening in a dielectric layer that exposes the first doped semiconductor layer, forming a second doped semiconductor layer over the first doped semiconductor layer, wherein the second doped semiconductor layer is formed by performing a second deposition process, an annealing process, and an etching process, wherein the second deposition process is different than the first deposition process; and
forming a metal-comprising structure over the second doped semiconductor layer, wherein the metal-comprising structure and the second doped semiconductor layer fill the opening in the dielectric layer.

17. The method of claim 16, wherein the first deposition process is an epitaxy process, and the second deposition process is a physical vapor deposition process, wherein the physical vapor deposition process implements a semiconductor target and a dopant target.

18. The method of claim 17, wherein:
the semiconductor target is a germanium-comprising target; and
the dopant target is a gallium-comprising target.

19. The method of claim 16, wherein the first deposition process is an epitaxy process, and the second deposition process is an atomic layer deposition process, wherein the atomic layer deposition process implements a semiconductor precursor and a dopant precursor.

20. The method of claim 19, wherein:
the semiconductor precursor is a germanium-comprising precursor; and
the dopant precursor is a gallium-comprising precursor.

* * * * *